US011075779B2

(12) United States Patent
Yu et al.

(10) Patent No.: US 11,075,779 B2
(45) Date of Patent: Jul. 27, 2021

(54) TRANSCEIVER BASEBAND PROCESSING

(71) Applicant: Intel Corporation, Santa Clara, CA (US)

(72) Inventors: Chuanzhao Yu, Phoenix, AZ (US); Hyun Yoon, Gilbert, AZ (US); Kurt Hausmann, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/958,123

(22) PCT Filed: Mar. 30, 2018

(86) PCT No.: PCT/US2018/025534
§ 371 (c)(1),
(2) Date: Jun. 25, 2020

(87) PCT Pub. No.: WO2019/190564
PCT Pub. Date: Oct. 3, 2019

(65) Prior Publication Data
US 2020/0366535 A1 Nov. 19, 2020

(51) Int. Cl.
*H04L 25/02* (2006.01)
*H03K 19/0185* (2006.01)
*H04L 27/20* (2006.01)

(52) U.S. Cl.
CPC ..... *H04L 25/0272* (2013.01); *H03K 19/0185* (2013.01); *H04L 25/0212* (2013.01); *H04L 27/20* (2013.01)

(58) Field of Classification Search
CPC . H04L 25/0272; H04L 25/0212; H04L 27/20; H04L 25/0274; H04L 25/028;
(Continued)

(56) References Cited

U.S. PATENT DOCUMENTS 4,437,171 A * 3/1984 Hudson ............... G11C 7/1051
257/370
5,202,594 A * 4/1993 Chang ............ H03K 19/018521
326/66
(Continued)

FOREIGN PATENT DOCUMENTS

WO WO-2019190564 A1 10/2019

OTHER PUBLICATIONS

P. Heydari and R. Mohanavelu, "Design of ultrahigh-speed low-voltage CMOS CML buffers and latches," in IEEE Transactions on Very Large Scale Integration (VLSI) Systems, vol. 12, No. 10, pp. 1081-1093, Oct. 2004, doi: 10.1109/TVLSI.2004.833663. (Year: 2004).*

(Continued)

*Primary Examiner* — James M Perez
(74) *Attorney, Agent, or Firm* — Schwegman Lundberg & Woessner, P.A.

(57) ABSTRACT

A buffer circuit includes a first feedback buffer to receive a first component of a current-mode signal and a second feedback buffer to receive a second component of the current-mode signal. The buffer circuit also including a first inverter having a first input coupled to an output of the second feedback buffer and to an input of a first current circuit through a first filter, a first output coupled to an input of the first feedback buffer. The buffer circuit also includes a second inverter having a second input coupled to an output of the first feedback buffer and to an input of a second current circuit through a second filter, and a second output coupled to an input of the second feedback buffer.

20 Claims, 20 Drawing Sheets

(58) Field of Classification Search
CPC ............ H04L 25/0282; H04L 25/0284; H04L 25/0286; H04L 25/029; H04L 25/0294; H04L 25/0296; H03K 19/0185; H03K 19/018507–018542; H03K 19/01855; H03K 19/018557–018592; H03K 2005/00026; H03K 2005/00267; H01L 2924/14253

See application file for complete search history.

(56) References Cited

U.S. PATENT DOCUMENTS

| | | | | | |
|---|---|---|---|---|---|
| 5,317,213 | A * | 5/1994 | Sato | ................ | H03K 3/356017 326/63 |
| 5,359,553 | A * | 10/1994 | Shiomi | .................... | G11C 7/22 326/110 |
| 5,502,406 | A * | 3/1996 | Traynor | ............. | H03K 19/0013 326/33 |
| 6,081,131 | A * | 6/2000 | Ishii | .............. | H03K 19/018571 326/68 |
| 6,172,524 | B1 * | 1/2001 | Cho | .............. | H03K 19/018585 326/70 |
| 6,184,737 | B1 * | 2/2001 | Taguchi | ............. | H04L 25/0278 327/319 |
| 6,194,949 | B1 * | 2/2001 | Hogeboom | .... | H03K 19/018528 326/27 |
| 6,396,329 | B1 * | 5/2002 | Zerbe | ....................... | G11C 7/02 327/319 |
| 6,597,229 | B1 * | 7/2003 | Koyata | .......... | H03K 19/018571 326/62 |
| 6,756,823 | B1 * | 6/2004 | Chen | ................ | H03K 3/356121 327/52 |
| 6,806,744 | B1 * | 10/2004 | Bell | ..................... | H03K 5/2481 327/53 |
| 7,064,586 | B2 * | 6/2006 | Kim | ................ | H03K 19/00384 327/77 |
| 7,598,788 | B2 * | 10/2009 | Cao | ................. | H03K 3/356034 327/266 |
| 7,639,043 | B2 * | 12/2009 | Koike | ................ | H03F 3/45237 326/82 |
| 8,463,206 | B2 * | 6/2013 | Yu | .......................... | H03F 3/193 455/118 |
| 8,463,226 | B2 * | 6/2013 | Yu | .......................... | H03F 3/193 455/334 |
| 8,797,064 | B1 * | 8/2014 | Ho | ................. | H03K 19/018521 326/86 |
| 9,031,515 | B2 * | 5/2015 | Mikhemar | ............. | H03F 3/195 455/73 |
| 9,130,600 | B2 * | 9/2015 | Mikhemar | ................ | H03F 3/19 |
| 9,184,957 | B2 * | 11/2015 | Chang | ............. | H04L 25/03019 |
| 9,553,742 | B1 * | 1/2017 | Xu | ..................... | H04L 25/0384 |
| 9,602,317 | B1 * | 3/2017 | Hailu | ................. | H03F 3/45183 |
| 9,654,310 | B1 * | 5/2017 | Chang | .............. | H04L 25/03057 |
| 10,128,965 | B1 * | 11/2018 | Wilson | ................... | H04B 17/21 |
| 10,224,905 | B1 * | 3/2019 | Lin | ................ | H03K 3/356104 |
| 10,340,938 | B1 * | 7/2019 | Eitan | ............... | H03K 3/356139 |
| 10,498,305 | B2 * | 12/2019 | Tajalli | ................ | H03G 3/3089 |
| 10,630,266 | B2 * | 4/2020 | Kim | ................ | H03F 3/45219 |
| 10,756,747 | B2 * | 8/2020 | Eitan | ............... | H03K 3/356191 |
| 2001/0011917 | A1 * | 8/2001 | Kim | ................ | H03K 3/356113 327/333 |
| 2003/0132788 | A1 * | 7/2003 | Takeshita | ......... | H03K 19/00384 327/108 |
| 2004/0046596 | A1 * | 3/2004 | Kaeriyama | ........... | H03L 7/0805 327/165 |
| 2004/0174191 | A1 * | 9/2004 | Radelinow | ........ | H04L 25/03878 327/65 |
| 2004/0258419 | A1 * | 12/2004 | Xu | .......................... | H03F 1/342 398/182 |
| 2005/0134331 | A1 * | 6/2005 | Kim | ................. | H03K 19/00384 327/108 |
| 2005/0168246 | A1 * | 8/2005 | Sharma | .................... | H03K 5/08 327/78 |
| 2006/0139066 | A1 * | 6/2006 | Kwon | ............ | H03K 19/018528 327/112 |
| 2006/0251428 | A1 * | 11/2006 | Gieseler | .............. | H03F 3/45183 398/189 |
| 2008/0042726 | A1 * | 2/2008 | Belot | ................... | H03D 7/1491 327/356 |
| 2009/0058525 | A1 * | 3/2009 | Damitio | .............. | H03F 3/45475 330/257 |
| 2009/0091389 | A1 * | 4/2009 | Koike | ................ | H04L 25/0272 330/257 |
| 2009/0295481 | A1 * | 12/2009 | Lin | ..................... | H03F 3/45928 330/253 |
| 2010/0019827 | A1 * | 1/2010 | Tamura | ................ | H03K 19/003 327/403 |
| 2010/0259298 | A1 * | 10/2010 | Huang | ............... | H03K 19/0013 326/71 |
| 2011/0129224 | A1 * | 6/2011 | Umeda | ................ | H03G 1/0017 398/58 |
| 2011/0175656 | A1 * | 7/2011 | Yu | ......................... | H04L 25/063 327/161 |
| 2012/0038344 | A1 * | 2/2012 | Kim | ........................ | G05F 1/56 323/311 |
| 2012/0039615 | A1 * | 2/2012 | Cho | ..................... | H04B 10/801 398/142 |
| 2012/0178400 | A1 * | 7/2012 | Yu | ...................... | H03F 3/45071 455/341 |
| 2012/0326754 | A1 * | 12/2012 | Hadji-Abdolhamid ..................... H03F 3/45179 327/108 |
| 2013/0039649 | A1 * | 2/2013 | Koizumi | .............. | H04B 10/697 398/25 |
| 2013/0040591 | A1 * | 2/2013 | Hausmann | ............... | H03H 7/25 455/127.2 |
| 2013/0040695 | A1 * | 2/2013 | Yu | .......................... | H03F 3/193 455/550.1 |
| 2013/0241651 | A1 * | 9/2013 | Yu | ....................... | H03F 3/45071 330/253 |
| 2014/0077890 | A1 * | 3/2014 | Babaie | ................. | H03B 5/1228 331/117 R |
| 2014/0218070 | A1 * | 8/2014 | Viani | ............. | H03K 19/018507 326/81 |
| 2015/0236699 | A1 * | 8/2015 | Li | .................. | H03K 19/017509 327/108 |
| 2015/0381177 | A1 * | 12/2015 | Canegallo | .......... | G01R 31/2886 326/82 |
| 2016/0006395 | A1 * | 1/2016 | Kim | ..................... | H03F 1/3205 330/261 |
| 2017/0286347 | A1 * | 10/2017 | Hinderer | ............... | G06F 13/4282 |
| 2019/0131945 | A1 * | 5/2019 | Lakshmikumar | ......... | G05F 1/46 |
| 2019/0326922 | A1 * | 10/2019 | Eitan | ................ | H03K 3/356139 |
| 2020/0144977 | A1 * | 5/2020 | Yu | .......................... | H03F 3/245 |
| 2020/0366535 | A1 * | 11/2020 | Yu | ....................... | H04L 25/0212 |

OTHER PUBLICATIONS

"International Application Serial No. PCT/US2018/025534, International Search Report dated Sep. 21, 2018", 4 pgs.
"International Application Serial No. PCT/US2018/025534, Written Opinion dated Sep. 21, 2018", 10 pgs.
"International Application Serial No. PCT US2018 025534, International Preliminary Report on Patentability dated Oct. 15, 2020", 12 pgs.

* cited by examiner

TRANSCEIVER BASEBAND PROCESSING

PRIORITY APPLICATION

This application is a U.S. National Stage Application under 35 U.S.C. 371 from International Application No. PCT/US2018/025534, filed Mar. 30, 2018, published as WO 2019/190564, which is incorporated herein by reference in its entirety.

TECHNICAL FIELD

Aspects described herein generally relate to radio communication circuits, and in particular, to circuits for processing baseband signals in a radio transceiver.

BACKGROUND

There has been a rapid proliferation of electronic products that rely on radio frequency based wireless communication techniques. Such products can include devices such as laptops, tablet computers, cellular telephones, and even general household appliances. As these devices become an increasingly ubiquitous part of a consumer's environment, the demand for more powerful and efficient radio frequency processing devices to support these products will increase. Meeting this demand can require improvements in the signal chains of at the core of these radio frequency processing devices.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

Figure 1:
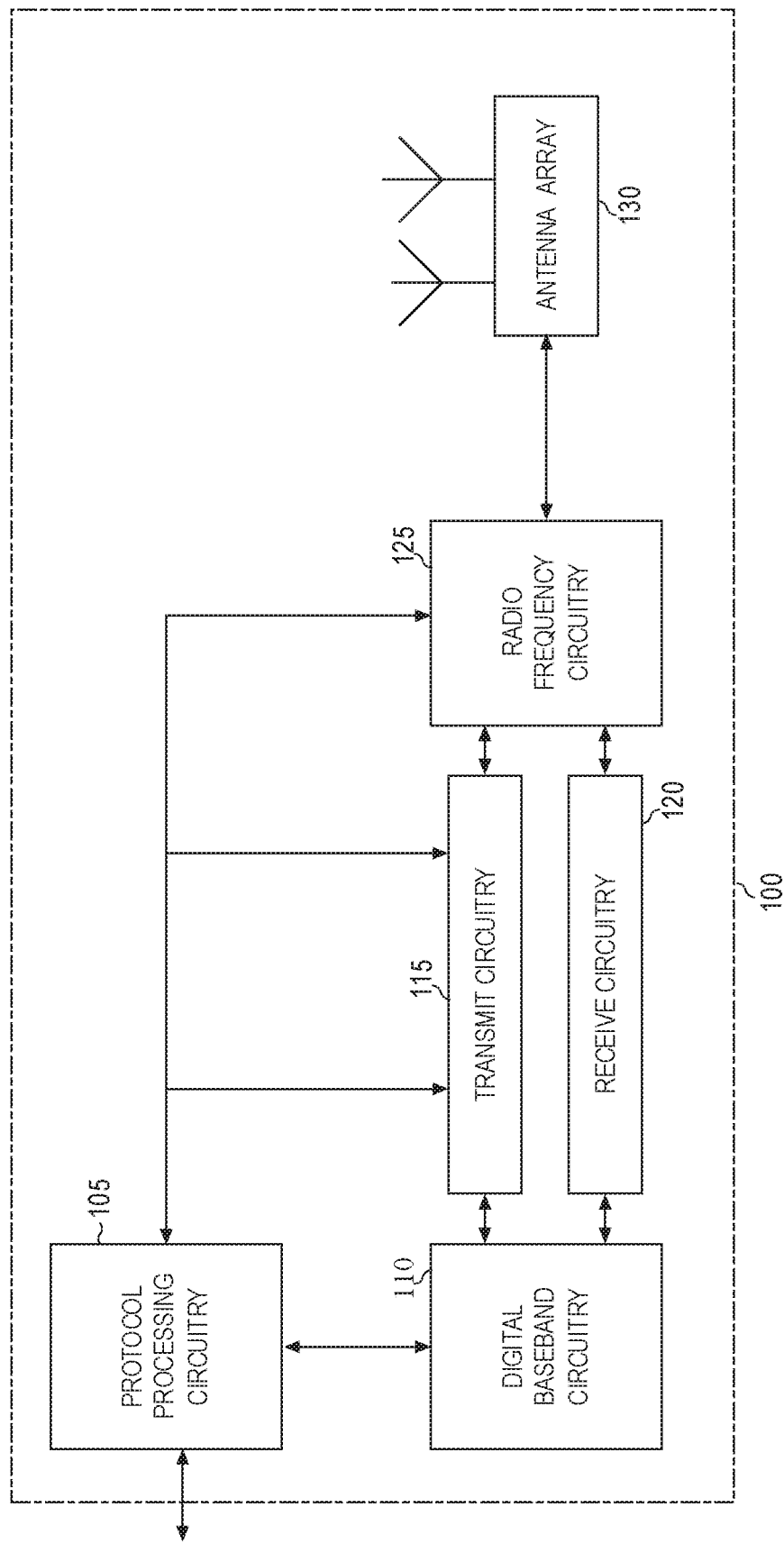
FIG. 1 illustrates a diagram of an example millimeter wave communication device having transceiver circuits for processing RF signals, according to some aspects.

In the following description, for purposes of explanation, numerous specific details are set forth in order to provide a thorough understanding of some example aspects. It will be evident, however, to one skilled in the art that the present disclosure may be practiced without these specific details.

Radio communication devices can include transceivers having one or more signal chains for generating or processing a radio frequency signal. A transceiver can include a receive signal chain that is configured to sample a radio frequency (RF) signal from an antenna, convert the sampled RF signal to a baseband signal, and transmit the baseband signal to one or more other circuits for further processing. A transceiver an also include a transmit signal chain that is configured to receive a baseband signal from one or more baseband processing circuits, covert the baseband signal to an RF signal, and transmit the RF signal to an antenna for emission.

In some aspects, class-B signal buffer having a current-mode (hereinafter. "signal buffer") output can be implemented using a pair of feedback buffers having their outputs cross-coupled to the inputs of two output inverters, where the outputs of the output inverters are coupled to the inputs of the feedback buffers and to output-current gain circuitry. A signal buffer implemented according to aspects of this disclosure can amplify and filter a differential current-mode signal without the use of operational amplifiers. Such a signal buffer can have improved current efficiency over class-A and class-AB operational amplifier based signal buffers. Such a signal buffer can be implemented using complementary-metal-oxide-semiconductor (CMOS) inverters, and is, therefore, well suited to be scaled with CMOS processes for smaller, lower powered devices.

Aspects of the present disclosure relate to techniques (e.g., circuits, systems, and methods) for a filter circuit to selectively remove common-mode or direct-current (DC) components from a baseband current-mode signal before upconverting the baseband signal to an RF signal. According to these techniques, common-mode feedback can be used to extract common-mode DC currents from a baseband signal at a current gain stage in an up-converter circuit of a transmit chain, while enabling alternating-current (AC) components of the baseband signal to enter a passive frequency mixer with a low-impedance load. A matching network can then convert the current-mode signal to a voltage mode signal for power amplification and transmission to an antenna. Such techniques can reduce power consumption and overheard limitations for certain up-conversion mixer circuits.

Aspects of the present disclosure also relate to techniques for reducing spatial mismatches in components of a processed signal, such as in systems having parallel processing circuitry or paths (e.g., logical or physical processing path) for processing components of a signal in parallel. Such techniques can include using switching circuitry at the beginning and at the end of the parallel processing circuitry or paths to alternate between a circuit or path used to process a given component of the signal, such as to cause spatial mismatches in the processed signal to attenuate over time due to, for example, averaging.

FIG. 1 illustrates a diagram of an example millimeter wave communication device having transceiver circuits for processing RF signals, according to some aspects. The millimeter wave communication circuitry 100 shown in FIG. 1 may be alternatively grouped according to functions. Components illustrated in FIG. 1 are provided here for illustrative purposes and may include other components not shown in FIG. 1.

The millimeter wave communication circuitry 100 may include protocol processing circuitry 105 (or processor) or other means for processing. The protocol processing circuitry 105 may implement one or more of medium access control (MAC), radio link control (RLC), packet data convergence protocol (PDCP), radio resource control (RRC) and non-access stratum (NAS) functions, among others. The protocol processing circuitry 105 may include one or more processing cores to execute instructions and one or more memory structures to store program and data information.

Millimeter wave communication circuitry 100 may further include digital baseband circuitry 110. The digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 100 may further include transmit circuitry 115, receive circuitry 120, and/or antenna array circuitry 130. In some aspects, the transmit circuitry 115 and the receive circuitry 120 can be constructed on a single device substrate. Millimeter wave communication circuitry 100 may further include RF circuitry 125. In some aspects. RF circuitry 125 may include one or multiple parallel RF chains for transmission and/or reception. Each of the RF chains may be connected to one or more antennas of the antenna array circuitry 130. Such RF chains can include one or more filters, power amplifiers, low noise amplifiers, programmable phase shifters and power supplies. Transmit circuitry 315 and receive circuitry 120 can be examples of a transmit signal chain and receive signal chain, respectively. In some aspects, the transmit signal chain can include portions of RF circuitry 125, such as a power amplifier for amplifying an RF signal before transmission to the antenna array 130.

In some aspects, protocol processing circuitry 105 may include one or more instances of control circuitry. The control circuitry may provide control functions for one or more of digital baseband circuitry 110, transmit circuitry 115, receive circuitry 120, and RF circuitry 125.

Figure 2:
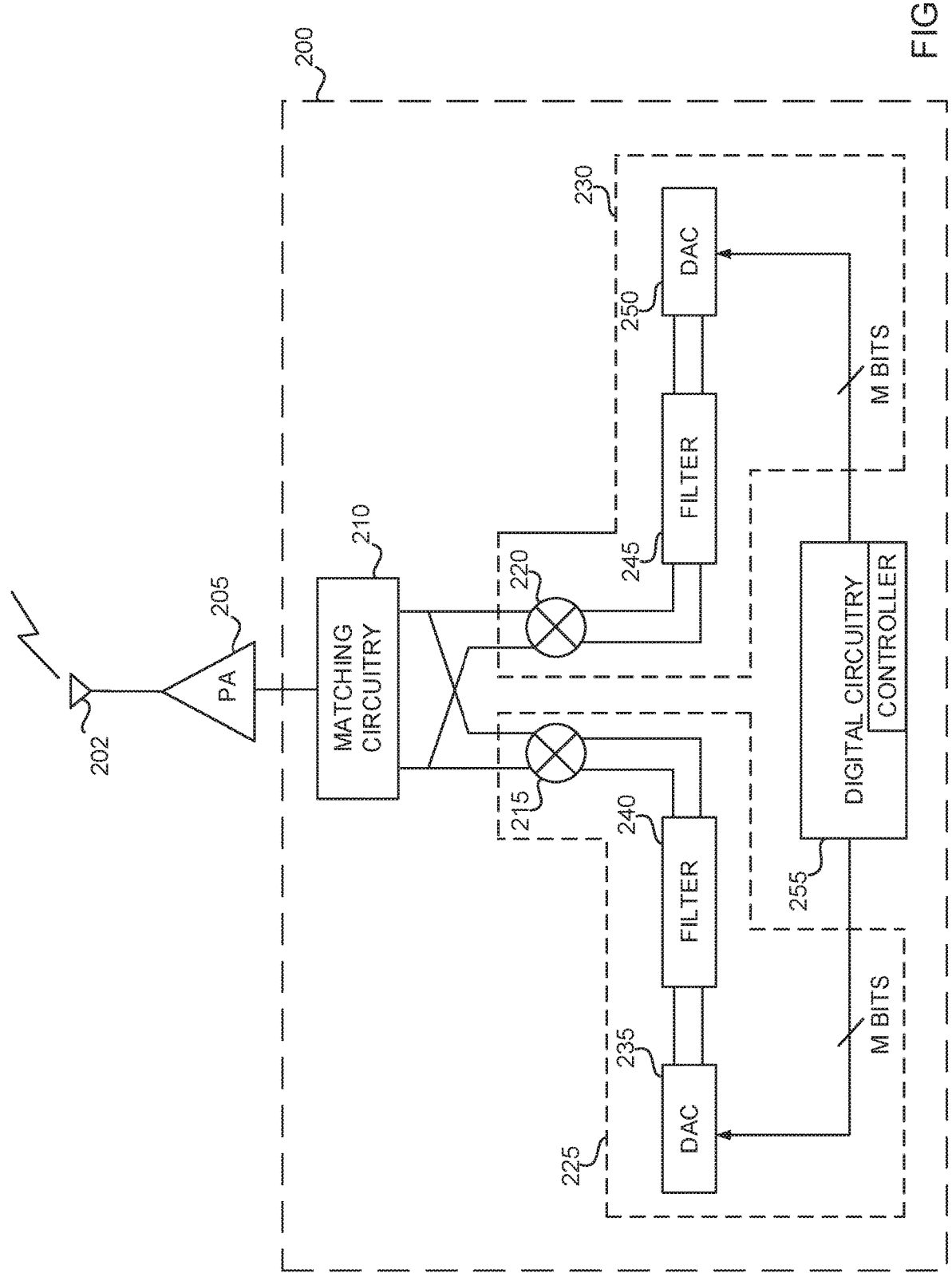
FIG. 2 illustrates an example transmit circuitry in a radio communication device configured to generate Cartesian modulated RF signals, according to some aspects.

FIG. 2 illustrates an example transmit circuitry 200 in a radio communication device configured to generate Cartesian modulated RF signals, according to some aspects. The transmit circuitry 200 can be an example transmit signal chain in an RF transceiver, such as transmit circuitry 115 (FIG. 1) and radio frequency circuitry 125. The Cartesian transmit circuitry 200 can include a matching network 210, an in-phase channel (hereinafter, "I-channel") 225, and a quadrature channel (hereinafter. "Q-channel") 230. According to some aspects, the transmit circuitry can also include digital circuitry 255, such as one or more baseband processing circuits. The digital circuitry 255 can provide digital in-phase and quadrature data to the I-channel 225 and the Q-channel 230, respectively. According to some aspects, the circuitry in the I-channel 225 can be substantially identical the circuitry in the Q-channel 230. Considering both channels, the digital in-phase data and the digital quadrature data can be converted to an analog signal using a digital-to-analog converter (DAC) 235 and a DAC 250, respectively. In some aspects, the DAC 235 and the DAC 250 can each generate and output a differential current-mode signal to low-pass filters 240 and 245, respectively. The low-pass filters 240 and 245 can filter the differential current-mode signals to remove high frequency components, such as noise and artifacts caused by the digital-to-analog conversion circuitry, such as sampling images caused by aliasing. In some aspects, the low-pass filter 240 and 245 can include a current-mode signal buffer or amplifier, such as the class-B signal buffer described herein. The output of the low-pass filters 240 and 245 can be coupled to frequency mixer circuitry 215 and 220. The frequency mixer circuitry 215 and 220 can each use a local oscillator to modulate the in-phase and quadrature baseband signal in the I-channel 225 and the Q-channel 230, respectively, such as to up-convert the analog baseband signals to RF signals. The RF output of the frequency mixer circuitry 215 and 220 can then be conditioned using matching network 210, and coupled to the antennal 202 using a power amplifier 205.

Figure 3:
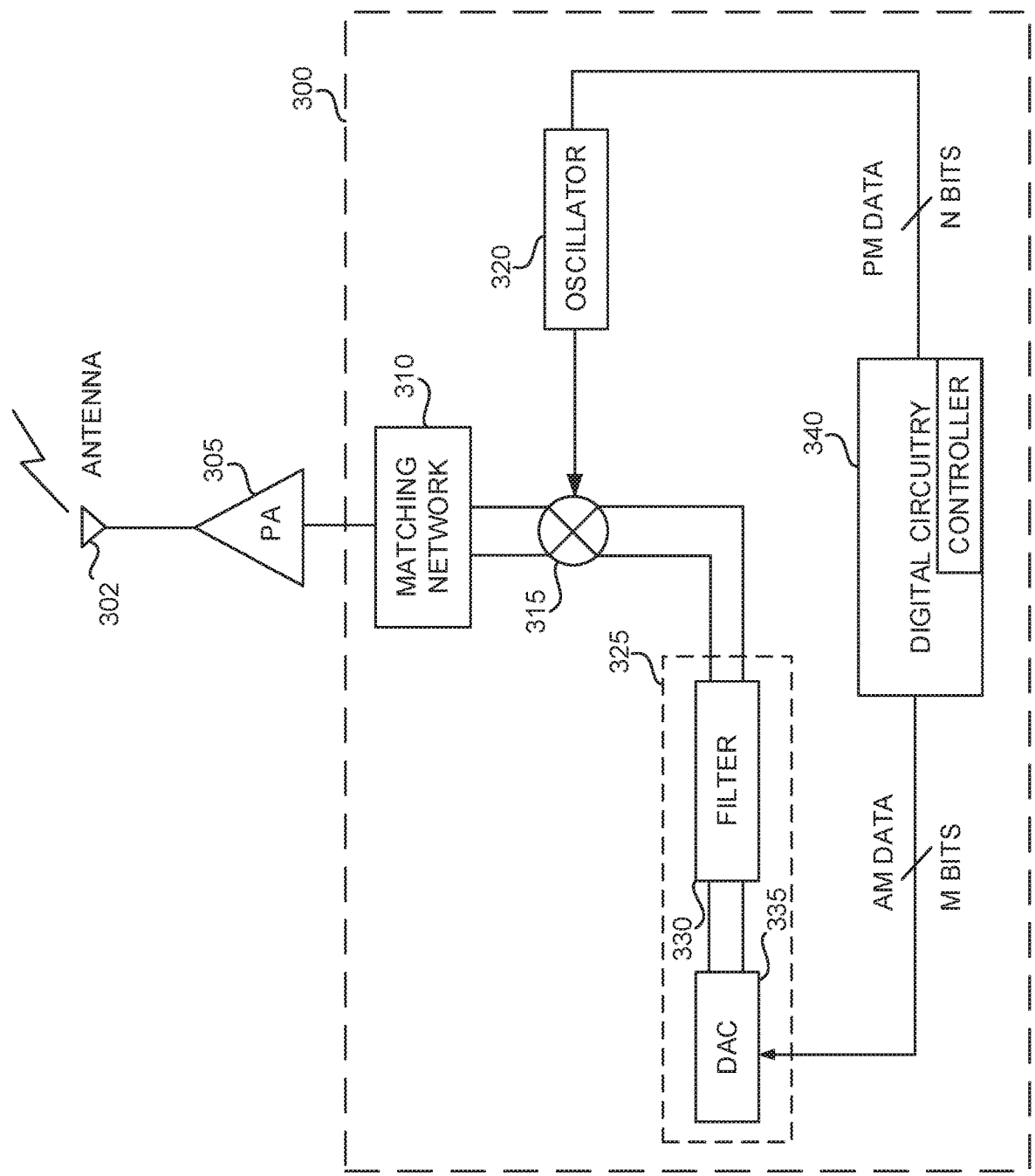
FIG. 3 illustrates an example transmit circuitry in a radio communication device configured to generate polar modulated RF signals, according to some aspects.

FIG. 3 illustrates an example transmit circuitry 300 in a radio communication device configured to generate Cartesian modulated RF signals, according to some aspects. The transmit circuitry 300 can be another example of aspects a transmit signal chain, or transmit circuitry. The transmit circuitry 300 can include a matching network 310, frequency mixer circuitry 315, oscillator circuitry 320, and an amplitude modulation (AM) path 325. According to some aspects, the transmit circuitry 300 can also include digital circuitry 340, such as one or more baseband processing circuits. The digital circuitry 340 can provide digital AM and phase modulation (PM) baseband data to the AM path 325 and to the oscillator circuitry 320, respectively. Oscillator circuitry 320 can use the PM baseband data to generate a modulated local oscillator signal for use by the mixer circuitry 315. Considering the AM path, the DAC 335 can convert the digital AM baseband data to a differential analog signal, such as a differential current-mode signal. The filter 330 can filter the differential current-mode signal to remove high frequency components, such as noise and artifacts caused by the digital-to-analog conversion circuitry. In some aspects the filter 330 can include a current-mode signal buffer, such as the class-B signal buffer described herein, such as to provide a filtered AM analog signal having a specified current gain to the mixer circuitry 315. The frequency mixer circuitry 315 can use the modulated local oscillator signal generated by the oscillator circuitry 320 to up-convert the analog AM baseband output of the filter 330 to an RF signal. The RF output of the frequency mixer circuitry 315 can then be conditioned using matching network 310, and coupled to the antennal 302 using a power amplifier 305.

Figure 4:
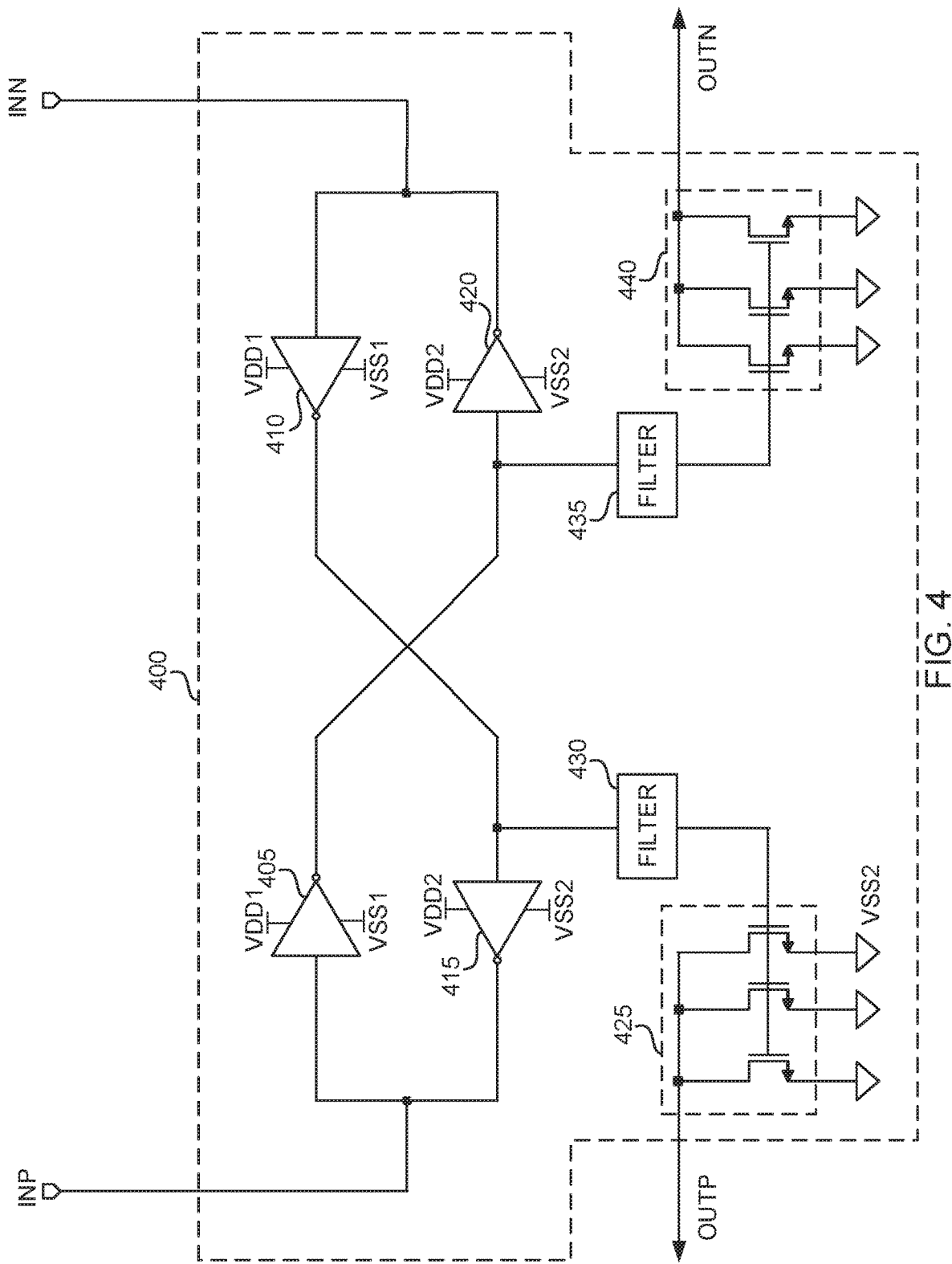
FIG. 4 illustrates an example class-B amplifier that can be used in a transmit circuitry of a radio communication device, according to some aspects.

FIG. 4 illustrates an example class-B signal buffer 400 that can be used in the transmit circuitry of a radio communication device, according to some aspects. In some aspects, the signal buffer 400 can be an example of a baseband filter, such as the filters 240 and 250 (FIG. 2) and the filter 330 (FIG. 3). The signal buffer 400 can be configured to amplify and filter a differential current-mode signal, such as an analog baseband signal received from DAC 235 (FIG. 2) or DAC 335 (FIG. 3), such as to provide a filtered current-mode output signal having a specified current gain. The signal buffer 400 can include an input stage such as cross-coupled feedback buffers 405 and 410, an output stage such as inverters 415 and 420, a filter stage such as filters 430 and 435, and a gain stage such as current gain circuitry 425 and 440. The feedback buffers 405 and 410 can be powered, or driven, by a first voltage, or power, supply having a high voltage rail VDD1 and a low voltage rail VSS1. The inverters 415 and 420 can be powered by a second voltage, or power, supply having a high voltage rail VDD2 and a low voltage rail VSS2. In some aspects, the first voltage supply can be selected to determine the DC bias point of the inverters 415 and 420. In certain aspects, the first voltage supply can be derived from the second voltage supply, such as by using a current mirror, or from another source.

The feedback buffers 405 and 410 can be two or more inverter-based logical buffers configured to alternately supply a high voltage (a logical 1) at the inputs of inverters 415 and 420 in response to a state of a differential current-mode signal, such as the differential current-mode signal INP and INN received from a baseband DAC. The inverters 415 and 420 can be two or more CMOS inverters, such as an inverter formed with a P-type field-effect-transistor (PFET) and an N-type field-effect-transistor (NFET) serially coupled between high and low rails of a voltage supply. The filters 430 and 435 can be any low-pass filter, such as a resistor-capacitor (RC) filter, configured to reject output band noise or any noise having a frequency greater than a threshold frequency. The current gain circuitry 425 and 440 can include two or more NFETs configured to amplify a current mirrored from the NFETs in the inverters 415 and 420.

Figure 5:
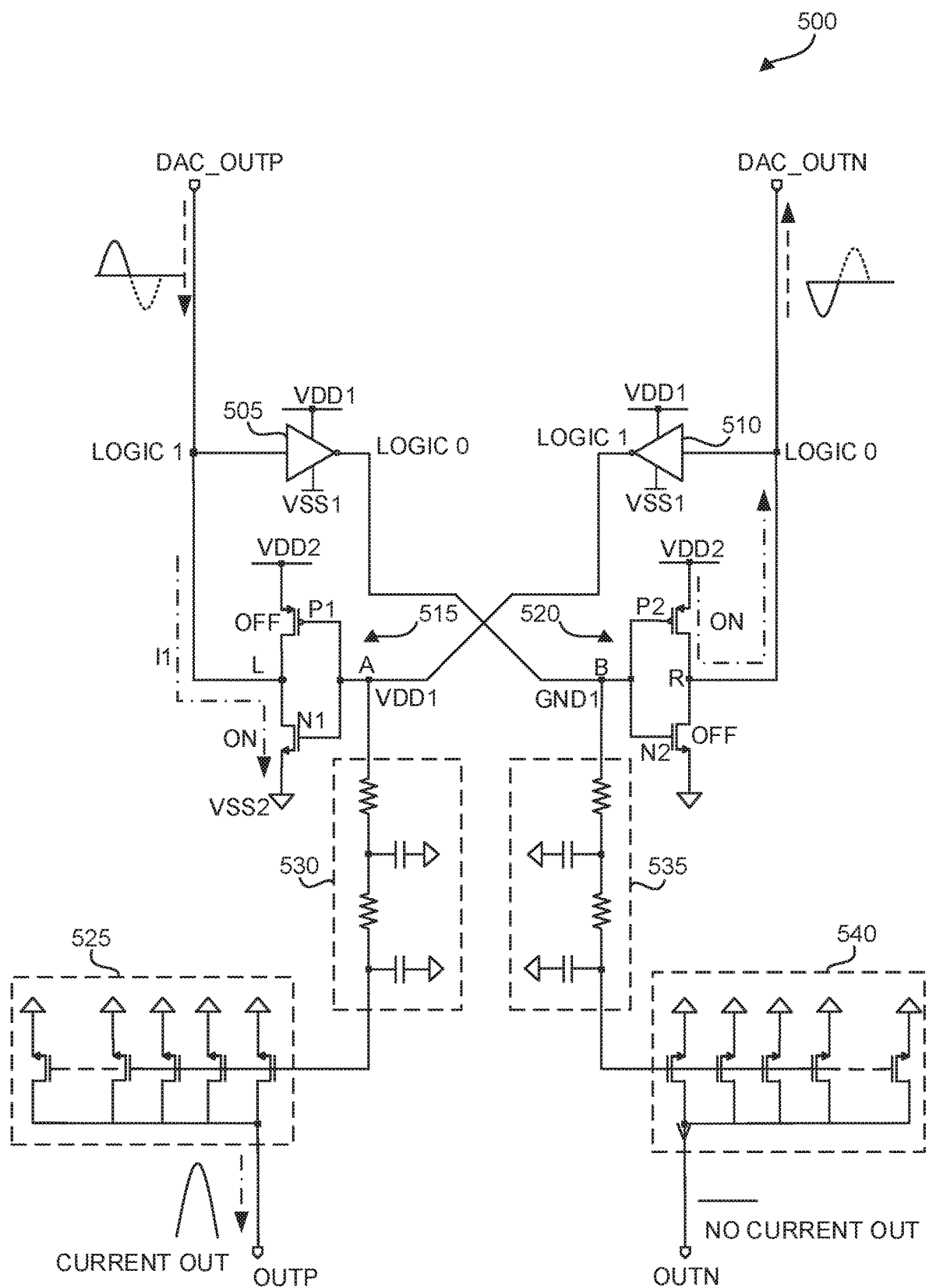
FIG. 5 illustrates a schematic diagram of an example class-B signal buffer that can be used in a transmit circuitry of a radio communication device, according to some aspects.

FIG. 5 illustrates a schematic diagram of an example class-B signal buffer 500 that can be used in the transmit circuitry of a radio communication device, according to some aspects. The signal buffer 500 can be an example of the signal buffer 400 (FIG. 4). The signal buffer 500, for example, can include feedback buffers 505 and 510, inverters 515 and 520, filters 530 and 535, and gain circuitry 525 and 540, such as to correspond to the feedback buffers 405 and 410, the inverters 415 and 420, the filters 430 and 435, and the gain circuitry 425 and 440.

FIG. 5 also illustrates an example of a flow of current through the signal buffer 500 while a differential current-mode input to the signal buffer is in a first state, such as during a first half period of a sinusoidal input, while a current (e.g., a positive current) is flowing into input node DAC_OUTP and while a current (e.g., a negative current) is flowing out of the input node DAC_OUTN. Although the discussion of FIG. 5 considers the use of sinusoidal currents or signals, the currents flowing into and out of the signal buffer 500 can be any differential analog current-mode signal. The current flowing into the signal buffer 500 can cause the input voltage of inverter 505 to rise to a threshold voltage, such as to cause the output of the feedback buffer 505 to transition from a logic 1 (high output voltage) to a logic 0 (low output voltage). The high voltage at the output of feedback buffer 505 can drive the voltage at node B low to VSS1, such as to turn OFF the NFET N2 of the inverter 520. The low voltage at node B can also turn ON the PFET P2, causing a current to flow out of the signal buffer 500 through P2. This negative current can lower the voltage at the input of feedback buffer 510, such as to eventually cause the output of the feedback buffer 510 to transition to a logic 1. The high voltage at the output of feedback buffer 510 can drive the voltage at node A high to VSS1, such as to turn ON the NFET N1 while turning off the PFET P1. A current I1 can flow into the signal buffer 500 through terminal DAC_OUTP transistor N1 when N1 is turned on.

In FIG. 5, the source and gate of N1 is connected to the same potential, respectively, as the source and gate of the NFETs in the current gain circuit 525. This configuration forms a current mirror, such as to cause a current flowing through N1 to be mirrored to the output of the current gain circuit 525. The amplitude of the mirrored current can be determined by the relative size (e.g., the width-to-length ratio) of N1 to the effective, or cumulative, size of the NFETs in the current gain circuit 525. In some aspects, each of the NFETs in the current gain circuitry 525 can be the same size of N1, such as to cause the effective size of the NFETs in the current gain circuit to a be a multiple of the size of N1. In such cases, the amplitude of the mirrored current at the output of the current gain circuit 525 can be approximately equal to the amplitude of the current flowing through N1 (e.g., I1) multiplied by the number of NFETs in the current gain circuitry 525.

In FIG. 5, a current mirror is formed by N2 and the output current gain circuitry 540. The transistor N2, however, is turned OFF for the current state of the differential input signal, and no current is mirrored to the output of current gain circuitry 540. The states of N1 and N2 can reverse when the differential input signal changes to a second state, such as during a second half period of sinusoidal input, when current flows out of the signal buffer 500 through node DAC_OUTP and into the signal buffer through node DAC_OUTN. During this state, N1 can be turned OFF and N2 can be turned ON, such as to cause a current flowing through N2 to be amplified and mirrored to the output of the current gain circuitry 540, while inhibiting a current from being mirrored to current gain circuitry 525. In some aspects, only one of the transistors N1 and N2 are turned ON for a given state the differential input signal. This ensures that only one of the current gain circuitry 525 and 540 can produce an amplified mirrored output current for a given state the differential input signal, causing the output of the signal buffer 500 to operate in a pure class-B mode.

In some aspects, the feedback buffers 505 and 510 can be equally, or similarly, sized. Similarly, N1, N2, the NFETs in the current gain circuitry 525, and the NFETs in the current gain circuitry 540, can be equally, or similarly, sized. Additionally, P1 and P2 can be equally, or similarly, sized.

In some aspects, substantially similar RC networks form low-pass filters 530 and 535, such as to filter high frequency components and other artifacts out of the currents mirrored to current gain circuitry 525 and 540.

Figure 6:
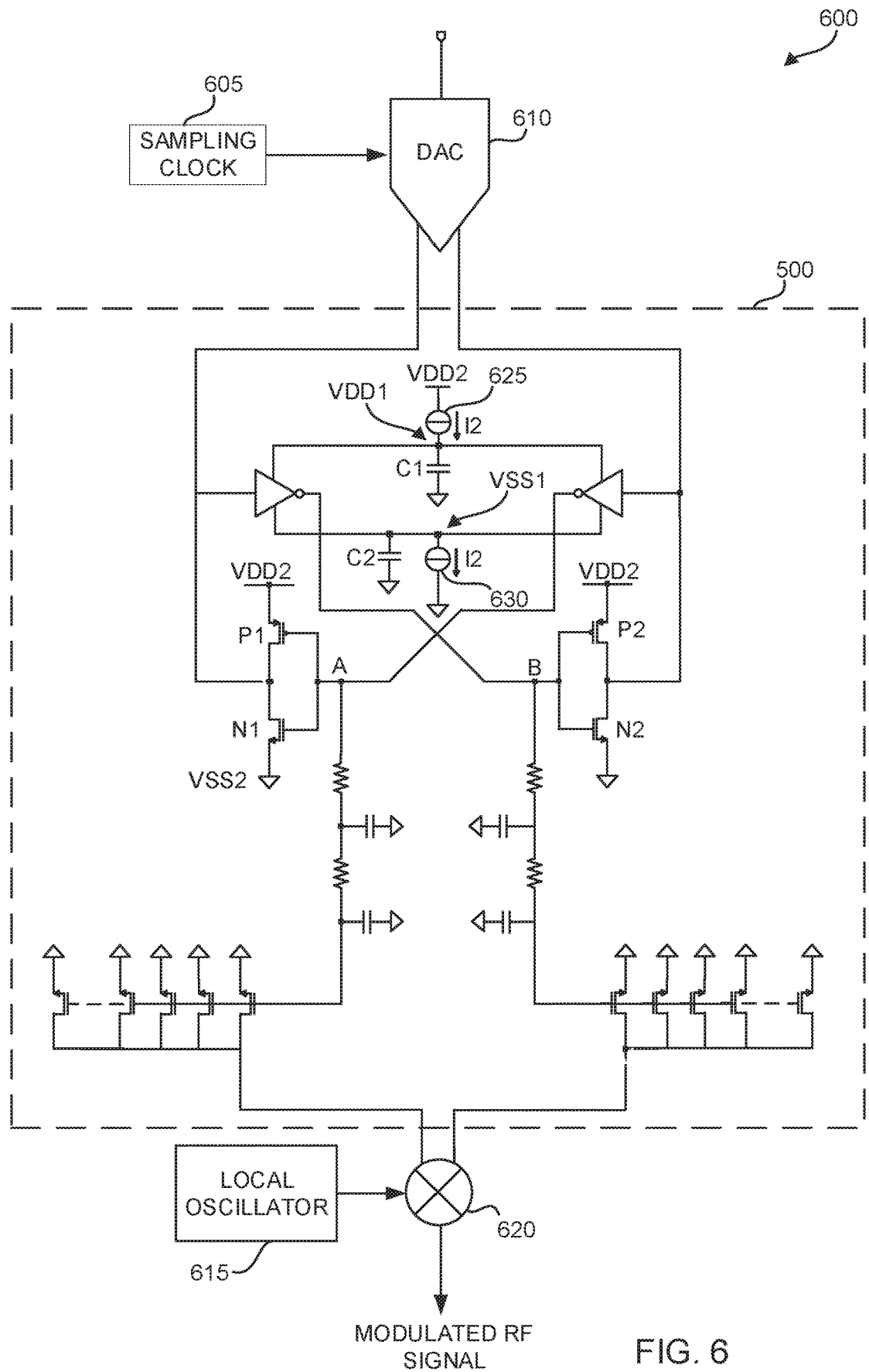
FIG. 6 illustrates an example system interfacing with a class-B signal buffer, according to some aspects.

FIG. 6 illustrates an example system 600 interfacing with the class-B signal buffer 500, according to some aspects. As shown in FIG. 6, the DAC 610 can use a baseband oscillator 605 to generate a differential current-mode signal. The signal buffer 400 can amplify and filter the differential current-mode signal, as described herein. The mixer 620 can then covert the output of the signal buffer 500 to an RF signal using local oscillator 615.

As shown in FIG. 6, the voltage supply rail VDD1 can be derived from the voltage supply rails VDD2 and VSS2, such as by using a current source 625 and storage capacitor C1. Similarly, the voltage supply rail VSS1 can be derived from the voltage supply rail VDD2 and VSS2, such as by using a current source 630 and storage capacitor C2. In some aspects, the current source 625 and the current source 630 can be outputs of a current mirror configured to source a current I2. The voltage supply rail VDD1 can be an NFET threshold voltage below VDD2, while VSS1 can be an NFET threshold voltage higher than VSS2.

Figure 7:
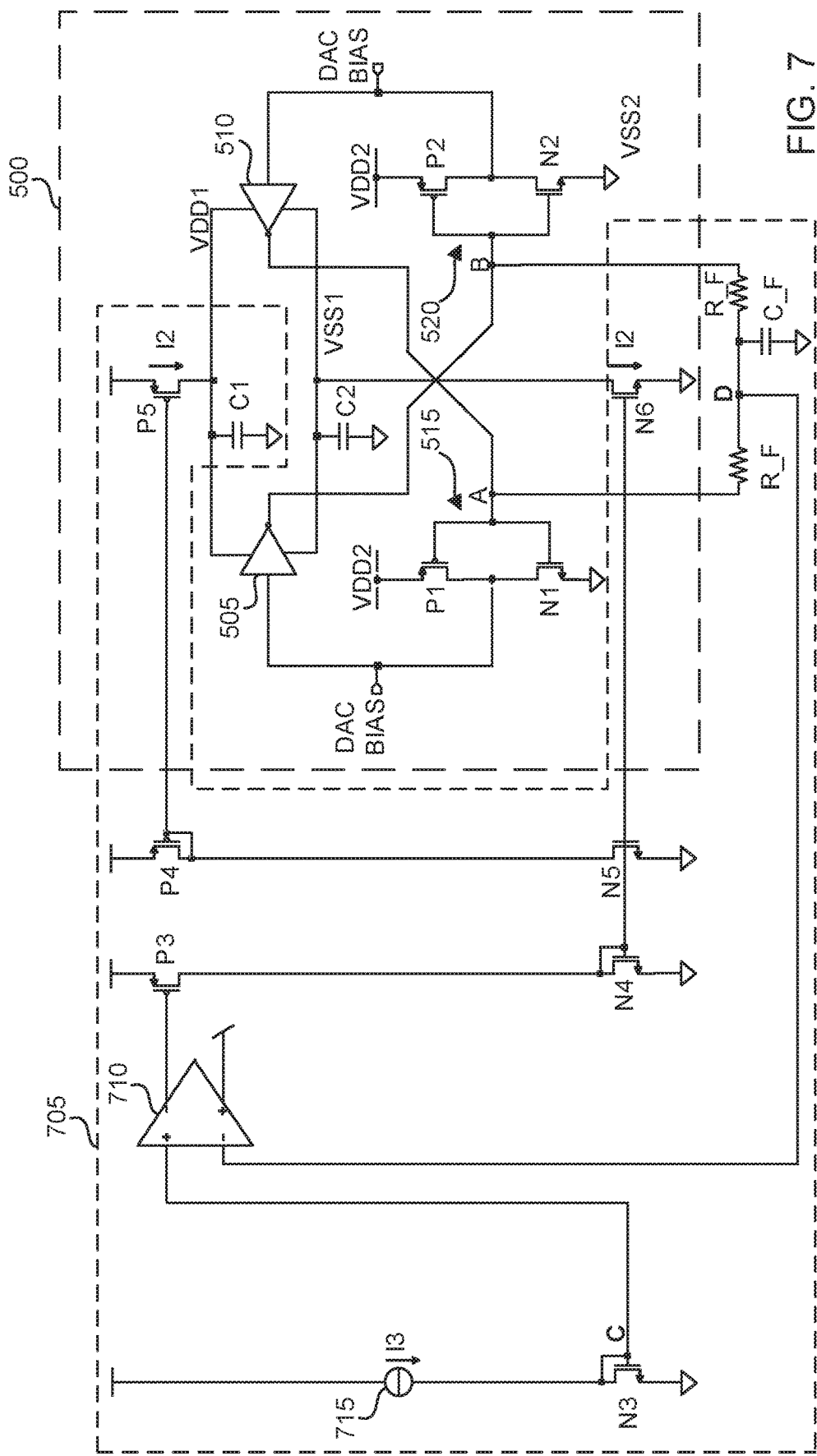
FIG. 7 illustrates an example biasing circuitry coupled to a class-B current amplifier, according to some aspects.

FIG. 7 illustrates an example biasing circuitry 705 coupled to the class-B signal buffer 500, according to some aspects. The biasing circuitry 705 can be configured to maintain a common-mode, or DC, bias at the input of inverters 515 and 520 close to the threshold voltage of the N1 and N2, such as to ensure that when the voltage at node A or B voltage drops below the common-mode bias, either N1 or N2 will be turned OFF, such as to cause the signal buffer 500 to generate the class-B output signals having a swing over the full range VDD1/VSS1.

The diode connected NFET N3 can set a reference voltage at node C based on a small DC bias current I3. In some aspects, N3 can be identical to N1 and N2. A current source 715 can be used generate the current I3, which can be on the order of, e.g., 3 microamperes. The current I3 can be selected to set the reference voltage at node C to approximately the threshold voltage of N1 and N2, such as determined by a current-voltage curve for N1 or N3. The common-mode bias of inverters 515 and 520 can be sampled at node D using an RC filter formed by resistors R_F and capacitor C_F. The values of R_F and C_F can be selected to form a low-pass filter to reject differential mode signals at nodes A and B. The sampled common-mode voltage at node D can be coupled to the operational amplifier 710, such as to form a negative feedback loop between the biasing circuitry 705 and the signal buffer 500. The operational amplifier can provide a control signal to the gate of PFET P3 based on a difference between the reference voltage at node C and the common-mode voltage at node D, such as to control the bias current I2 generated by the current mirror formed by PFETs P3, P4, P5 and NFETs N4, N5, and N6, such as to minimize the difference between the reference voltage and the common-mode voltage. The bias current I2 flowing through P5 and N6 can determine the common-mode output voltage level of feedback buffers 505 and 510, such as to determine the common-mode bias of inverters 515 and 520. In some aspects, P5 and N6 can be examples of the current sources 625 and 630, respectively.

Generally, the current I2 can be adjusted by the operational amplifier 710 according to a difference between the reference voltage at node C and the common-mode voltage a node D. At steady, or static, state, the voltage at node D can be the same as the voltage at node C due to, for example, regulation by the negative feedback loop formed by the operational amplifier 710, the current mirror, and feedback buffers 405 and 410.

Figure 8:
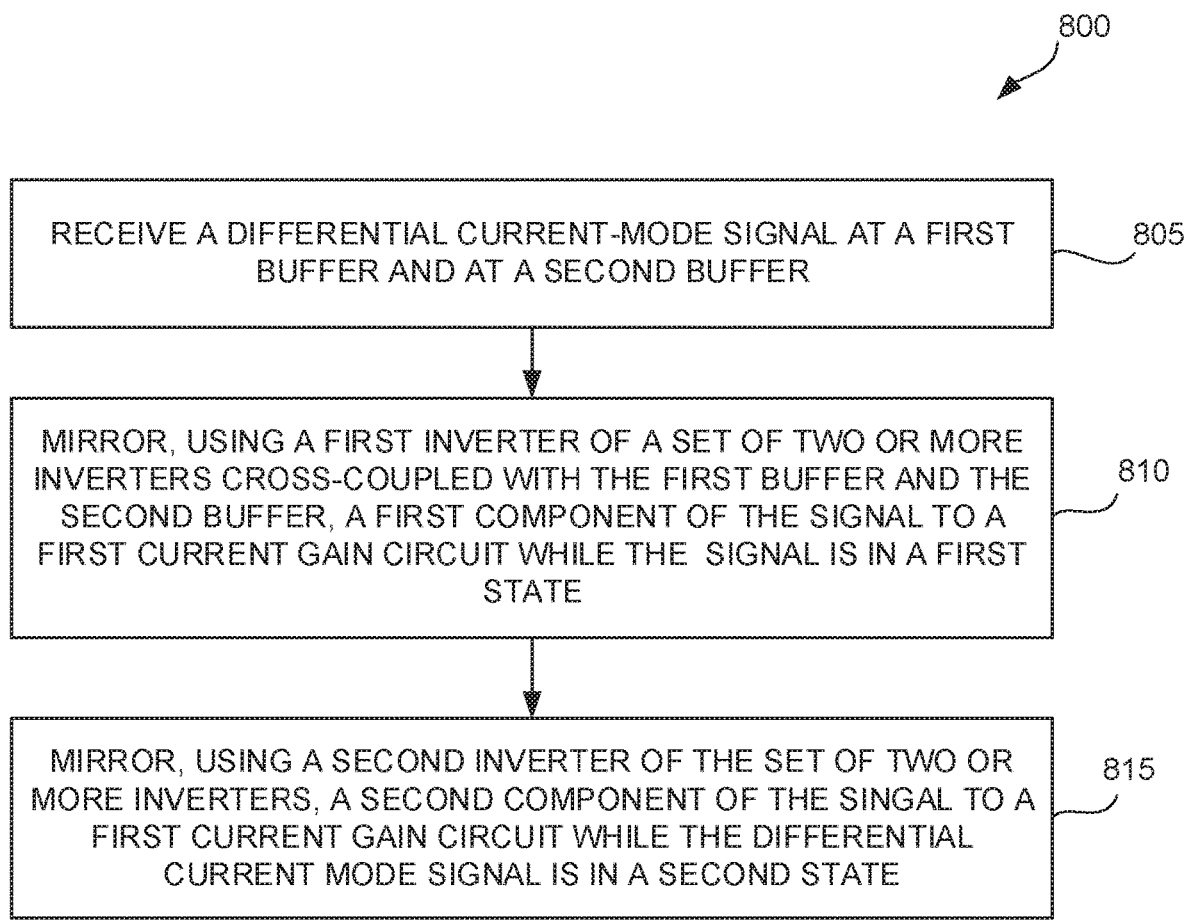
FIG. 8 illustrates a flowchart of a set of operations for operating a class-B current amplifier, according to some aspects.

FIG. 8 illustrates a flowchart of a set of operations 800 for operating a class-B signal buffer, according to some aspects. The class-B signal buffer can be an example of the signal buffer 500, as shown in FIGS. 5-7. At operation 805, the signal buffer can receive a differential current-mode signal at a first buffer and at a second buffer. Such differential signal can be a current-mode differential signal generated by a DAC, as described herein. The first buffer and the second buffer can be an inverter based buffer, such as the feedback buffer 505 and 510, as shown in FIGS. 4-7. At operation 810, a first inverter of a set of two or more inverters cross-coupled with the first buffer and the second buffer can be operated to mirror first component of the differential signal (e.g., a current of the first component of the differential signal) flowing into the signal buffer to a first current gain circuit while the differential current-mode signal is in a first state. At operation 815, a second inverter of the set of two or more inverters can be operated to mirror a second component of the differential current-mode signal flowing into the signal buffer to a second current gain circuit while the differential current-mode signal is in a second state.

In some aspects, the set of operations can include filtering the mirrored first component and second component of the differential current-mode signal using a low-pass filter, such as an RC low-pass filter.

In some aspects, operating, or causing, the first inverter to mirror the first component of the differential current-mode signal includes sinking the first component of the differential current-mode signal through an N-type field-effect-transistor (NFET) of the first inverter.

In certain aspects, the set of operations 800 can further include providing a first voltage supply to power the first buffer and the second buffer, while providing a second voltage supply to power the first inverter and the second inverter. The set of operations 800 can also include determining a direct-current bias point for the first inverter and the second inverter based on the first supply voltage and an output of the first buffer and the second buffer. Additionally, when the first inverter and the second inverter include an NFET, providing the first voltage supply can include providing a high voltage rail of the first voltage supply that is a threshold voltage of an NFET lower than a high voltage rail of the second voltage supply, and providing a low voltage rail of the first voltage supply that is a threshold voltage of the NFET higher than a low voltage rail of the second voltage supply.

In some aspects, the first inverter and the second inverter can be alternatively turned ON and OFF in response to the differential current-mode signal, such as to generate a class-B current-mode signal at an output of the first current again circuit and at an output of the second current gain circuit.

Figure 9:
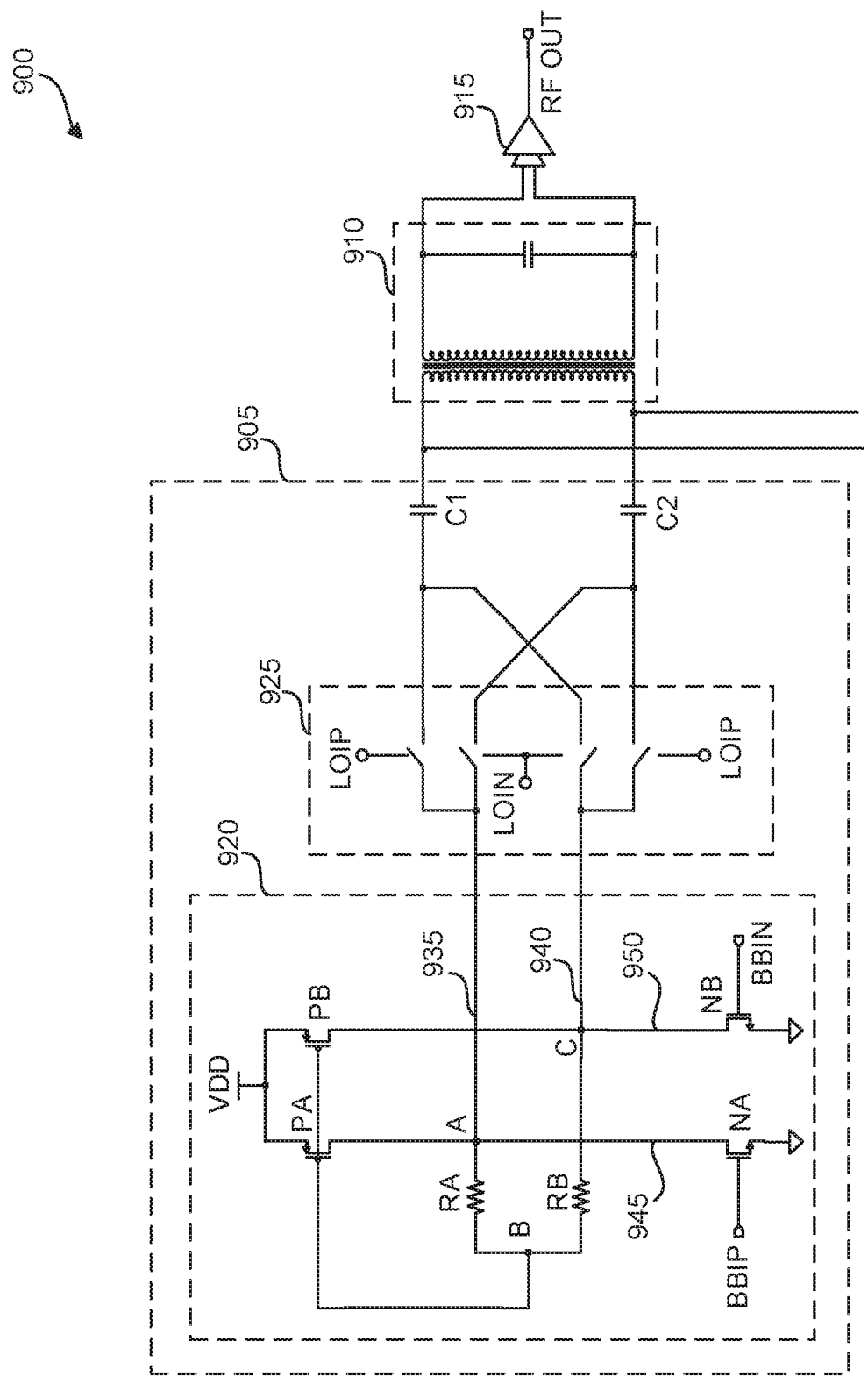
FIG. 9 illustrates an example device having a modulation circuit for modulating a channel of a transmit signal chain, according to some aspects.

FIG. 9 illustrates aspects of an example of an up-converter 900 having a modulation circuit for modulating a channel of a transmit signal chain, according to some aspects. The up-converter 900 can be an example of circuitry of a transmit chain, such as the filter 240 and 245, the mixer circuitry 215 and 220, matching network 210, and power amplifier 205, as shown in FIG. 2. The up-converter 900 can include a modulation circuit 905, matching circuitry 910, and a power amplifier 915. In some aspects, the up-converter 900 can be included in a transmitter signal chain of a transceiver, such as the transmitter 200 (FIG. 2). Accordingly, modulation circuit 905 can be an example of one modulation circuit of a pair of modulation circuits configured to convert a baseband differential voltage-mode in-phase or quadrature signal to an RF signal, such as for transmission to an antenna.

The modulation circuit 900 can include a filter circuit 920, a switching circuit 925, and a coupling capacitors C1. The filter circuit 920 can receive a baseband signal at a gate of NFET NA and NFET NB. Transistors NA and NB can generate currents in branches 945 and 950 in response to the receiving the baseband signal. Such currents can include both DC and AC components. The resistors RA and RB form a common-mode feedback tap point at node B, such as to sample, or sense, voltages developed at nodes A and C and additively combine the samples at node B. The values of RA and RB can be selected to be large enough to provide a high impedance path for AC currents to the tap point. Additionally, the sizes (e.g., the width-to-length ratios) of PA and PB can be selected to set a DC bias point at nodes A and C. A negative feedback loop can be formed between nodes A and C, the resistors RA and RB, and the transistors PA and PB, such as to adjust the impedance of, or the current conducted by, PA and PB to maintain the DC bias at nodes at A and C.

The AC, or differential, components of the currents flowing through branches 945 and 950 can cause differential voltages to develop between nodes A and C. Such differential voltages will be attenuated by RA and RB, and additively summed at node B to cancel each other. Consequently, these differential voltages will not be coupled to the gates of PA and PB through the negative feedback loop. As a result, PA and PB will show a high impedance drain to source path to the AC currents in branches 945 and 950. When RA and RB are large enough (e.g., compared to the impedance looking into the mixer 925), these AC currents can see a much lower impedance path to ground through the mixer 925. The impedance looking into the mixer 925 can generally be determined by the input impedance (e.g., due to the inductive reactance) of the balun or matching circuitry 910. The effective capacitance of C1 and C2 appears in series with the primary winding of the balun 910, such as to form a series inductor-capacitor (LC) resonant circuit. The capacitors C1 and C2 can, therefore, be selected cause the resonant frequency of the series LC resonant circuit to match the frequency of the local oscillator inputs LOIP and LOIN, such as to cause the capacitive reactance of the C1 and C2 to cancel the inductive reactance of the balun, such as to reduce the input impedance of the balun to near zero. As a result, most of the AC current generated in branches 945 and 950 by NA and NB can be conducted to the mixer 925 through branches 935 and 940.

The DC components of the currents generated in branches 945 and 950 by NA and NB can develop common-mode voltages at nodes A and C. These common-mode voltages can additively combine at node B without canceling each other. The combined common-mode voltage at node B can feedback to the gates of PA and PB, such as to control the drain-to-source current in these transistors, such as to maintain the common-mode bias at nodes A and C. Such control can cause the DC currents in branches 945 and 950 that generated the common-mode voltages at nodes A and C to see a low impedance path to VDD though PA and PB. Conversely, DC or low frequency currents flowing into mixer 925 will see an effectively open circuit to ground or VDD due to DC blocking by C1 and C2. As a result, only nominal amounts of DC current can be conducted into the mixer 925.

Figure 10:
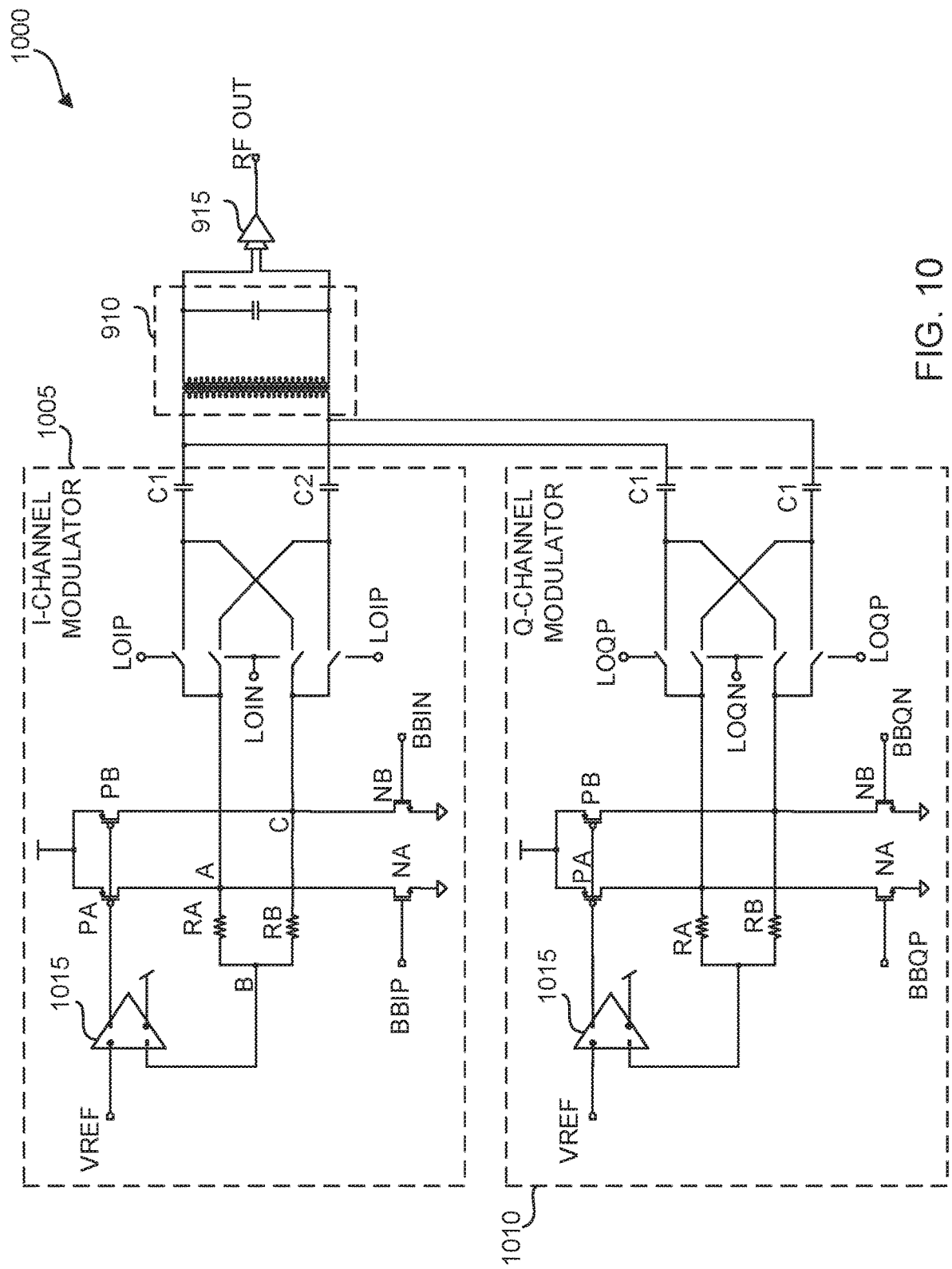
FIG. 10 illustrates an example device having modulation circuits for modulating channels of a transmit signal chain, according to some aspects.

FIG. 10 illustrates an example up-converter 1000 having modulation circuits 1005 and 1010 for modulating channels of a Cartesian transmit signal chain, according to some aspects. The up-converter 1000 can include a balun 910, a power amplifier 915, an in-phase channel modulation circuit 1005, and a quadrature channel modulation circuit 1010. The in-phase channel modulation circuit 1005 and the quadrature channel modulation circuit 1010 can be examples of the same modulation circuitry. The modulation circuits 1005 and 1010 can be identical to the modulation circuit 905, with exception for the insertion of the amplifier 1015 in the negative feedback loop formed by nodes A and C, the resistors RA and RB, and the transistors PA and PB. The amplifier 1015 can be a differential amplifier or an operation amplifier, configured to control the PA and PB in response to a reference voltage VREF and a common-mode voltage at node B. Including the amplifier 1015 in negative feedback loop can enable a common-mode bias at A and C to be determined based on VREF. The added gain provided by the amplifier 1015 can also provide more flexibility in choosing the size of PA and PB, such as for determining the common-mode bias at A and C.

In some aspects, the coupling capacitors C1 and C2 can provide isolation between the in-phase modulation circuit 1005 and the quadrature modulator modulation circuit 1010, such as by blocking baseband signals from each modulation circuit from affecting the other.

Figure 11:
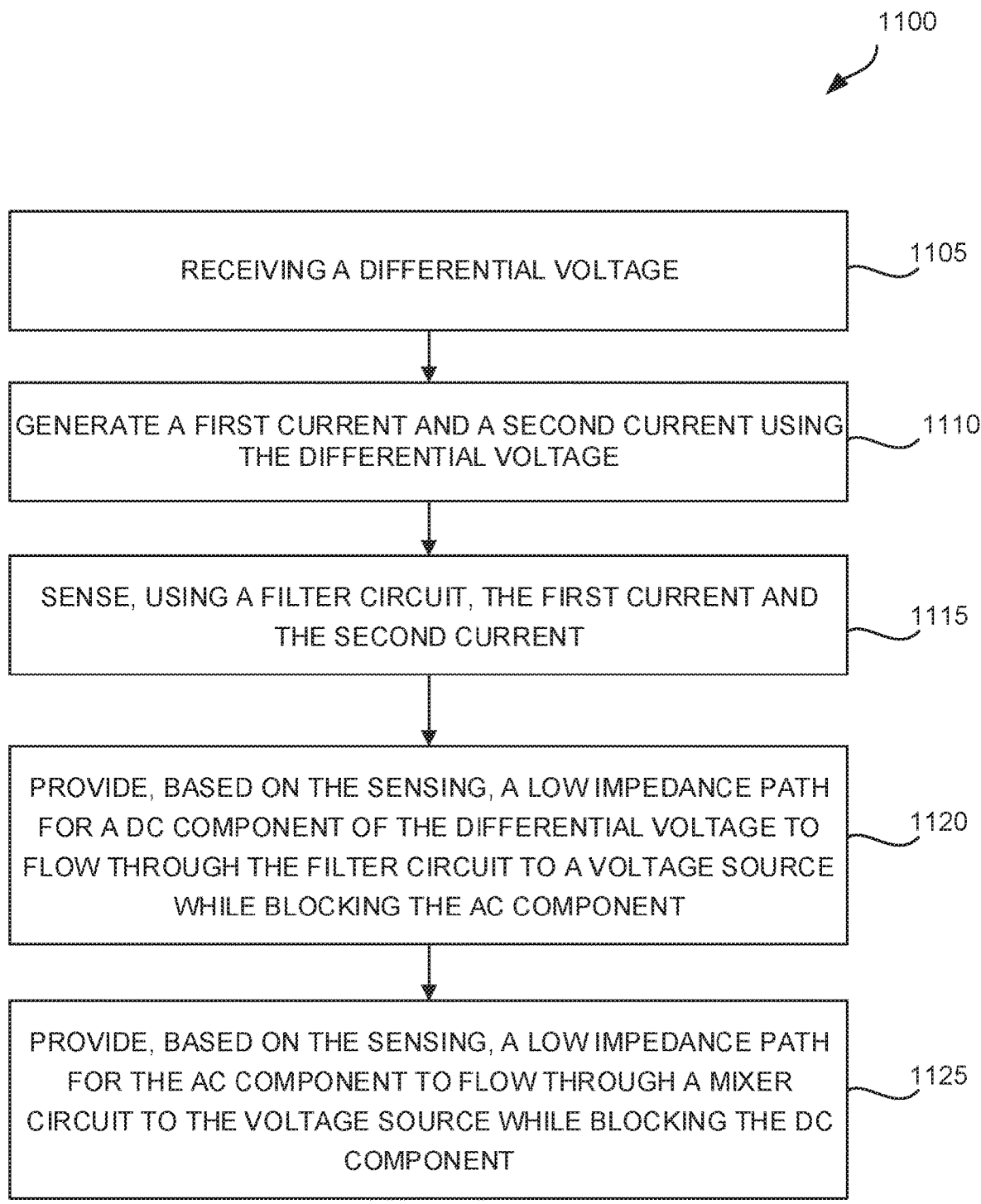
FIG. 11 illustrates a flowchart of a set of operations for operating a modulation circuit for modulating a channel of a transmit signal chain according to some aspects.

FIG. 11 illustrates a flowchart of a set of operations 1100 for operating a modulation circuit for modulating a channel of a transmit signal chain, according to some aspects. At operation 1105 a voltage mode differential signal can be received. At operation 1110, a first current and a second current can be generated using the differential signal. At operation 1115, the filter circuit can sense or sample the first current and the second current, such as to determine a common-mode feedback component of the first and second current. At operation 1120, the modulation circuit can provide, based on the sensing, a low impedance path for a DC component of the first current and a DC component of the second current to flow through the filter circuit to a voltage source while blocking an AC component of the first current and an AC component of the second current to the voltage source. At operation 1125, the modulation circuit can provide, based on the sensing, a low impedance path for the AC component of the first current and the AC component of the second current to flow through a mixer circuit to the voltage source while blocking the DC component of the first current and the DC component of the second current.

Figure 12:
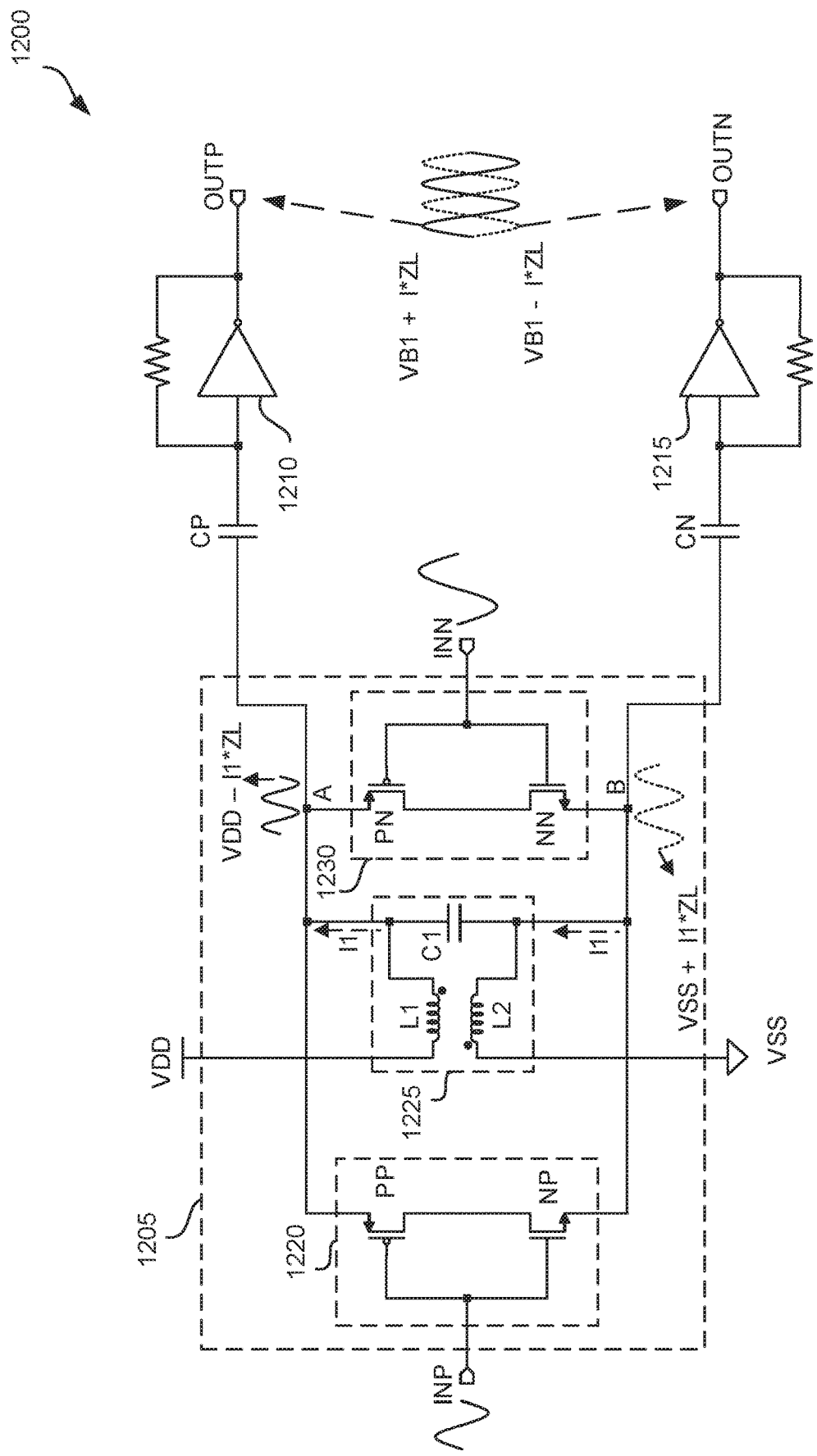
FIG. 12 illustrates an example of a system having a circuit for doubling a frequency of a differential signal, according to some aspects.

FIG. 12 illustrates an example system 1200 having a frequency doubler 1205 for doubling a frequency of a differential signal, according to some aspects. The system 1200 can be part of oscillator or clock generation circuitry in a transmit chain or a receive chain of a transceiver. According to some aspects, the system 1200 can receive a differential signal, such as the differential output of an oscillator circuit, at inputs INP and INN. The frequency doubler 1205 can use the received differential signal to generate a differential output signal at nodes A and B having double the frequency of the input differential signal. The differential output signal can be capacitively coupled, using capacitors CP and CN, from nodes A and B to self-biasing buffers 1210 and 1215. The self-biasing buffers 1210 and 1215 can then transmit the differential output signal to one or more other circuits, such as a frequency mixer associated with an up-converter circuit or a down-converter circuit.

The frequency doubler 1205 can include an inverter 1220, a coupling circuit 1225, and another inverter 1230. The coupling circuit 1225 can include inductors L1 and L2, and capacitor C1.

Inductors L1 and L2 can be cross-coupled, such as to ensure that when a current flows through L1 in a first direction, a similar current flows through L2 in the opposite direction. Cross-coupling can increase mutual inductance between each inductor, which can increase, or enhance, the impedance from nodes A and B to positive and negative voltage supplies, while saving device layout space. In some aspects. L1 and L2 can be substantially identical inductors. Inductor L1 can be connected to a global positive or high voltage supply rail VDD, such as to couple a local positive supply rail VA (not shown) to PFETs PP and PN at node A. Inductor L2 can be connected to a global negative or low voltage supply rail VSS, such as to couple a local negative supply rail VB (not shown) to NFETs NP and NN at node B.

In some aspects a capacitor C1 can be coupled in parallel with the inductors L1 and L2, such as to help filter harmonics or other undesirable frequencies, and to increase the impedance seen by at nodes A and B by signals having desired frequencies. As an example, the values of L1, L2 and C1 can be selected to cause a L1, L2, and C1 to resonate at a resonance frequency that is twice as high as the frequency of the received differential signal.

The inverters 1220 and 1230 can have a DC input bias at a midpoint voltage between VA and VB. This biasing can cause the NFETs and PFETs in in each inverter to turn ON when their respective inputs INP and INN are within one PFET threshold voltage $V_{thp}$ of VA and within one NFET threshold voltage $V_{thn}$ of VB, as expressed by the inequality in equation (1).

$$(VB+V_{thn})) < INP, INN < (VA-V_{thp}) \quad (1)$$

Figure 13:
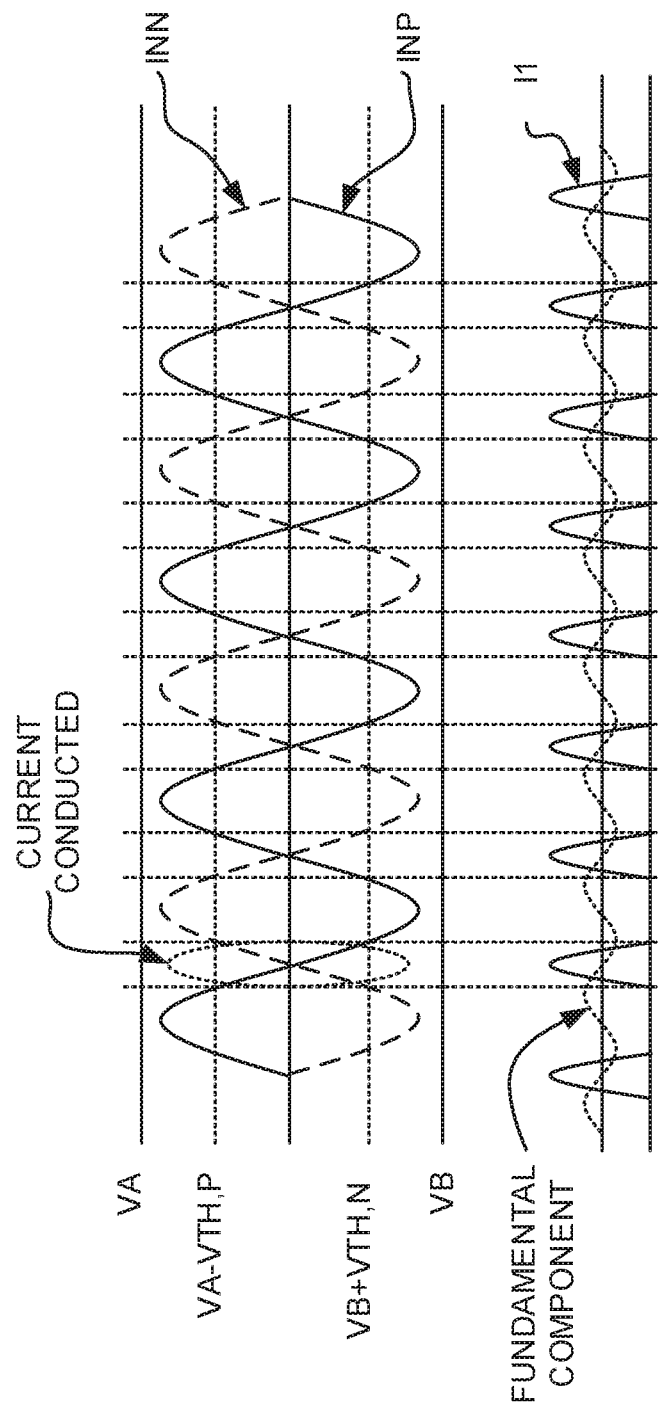
FIG. 13 illustrates a diagram of example waveforms of signals in a circuit for doubling a frequency of a differential signal, according to some aspects.

As an example, when a voltage at the input INP satisfies the inequality in equation (1). PP and NP can be ON, causing a current to flow through the inverter 1220 from node A to node B. Similarly, when voltage at the input INN satisfies the inequality in equation (1), PN and NN can be ON, causing a current to flow through the inverter 1230 from node A to node B. For sinusoidal differential inputs at INP and INN, inverter 1220 and inverter 1230 can each conduct current two times for each half period of the sinusoid, as shown in FIG. 13. Accordingly, the current flowing into node A and out of node B can have twice the frequency of the received differential signal. The current I1 can develop a voltage at node A and B, such as due to the impedance of the coupling circuit 1225. The voltage at nodes A and B due to I1 and the impedance of the coupling circuit 1225 is given by equations (2) and (3), where ZL can be the impedance of a load looking into coupling circuit 1225.

$$VA = VDD - I1 \cdot ZL \quad (2)$$

$$VB = VSS + I1 \cdot ZL \quad (3)$$

The load impedance ZL can be determined by the combined impedance of L1, L2, and C1, such as determined by the resonance between the L1, L2, and C1, and the mutual inductance attributable to the cross-coupling of L1 and L2. Consequently, selecting C1 to resonate with L1 and L2 at twice the frequency of the received differential signal, and cross-coupling L1 and L2, can enable the frequency doubler circuit 1200 to generate an output signal having twice frequency of the received differential signal and increased amplitude, or voltage swing, while reducing layout space, such as would be required for larger devices required to produce an equivalent output signal.

FIG. 13 illustrates a diagram of an example set of waveforms of signals in the frequency doubler 1205 for doubling a frequency of a differential signal, according to some aspects. As shown in FIG. 13, the current I1, generated in response to the differential signal INP and INN has twice the frequency of INP/INN due to the inverters 1220 and 1230 conducting twice during each half period of the differential signal INN and INP, as described herein.

Figure 14:
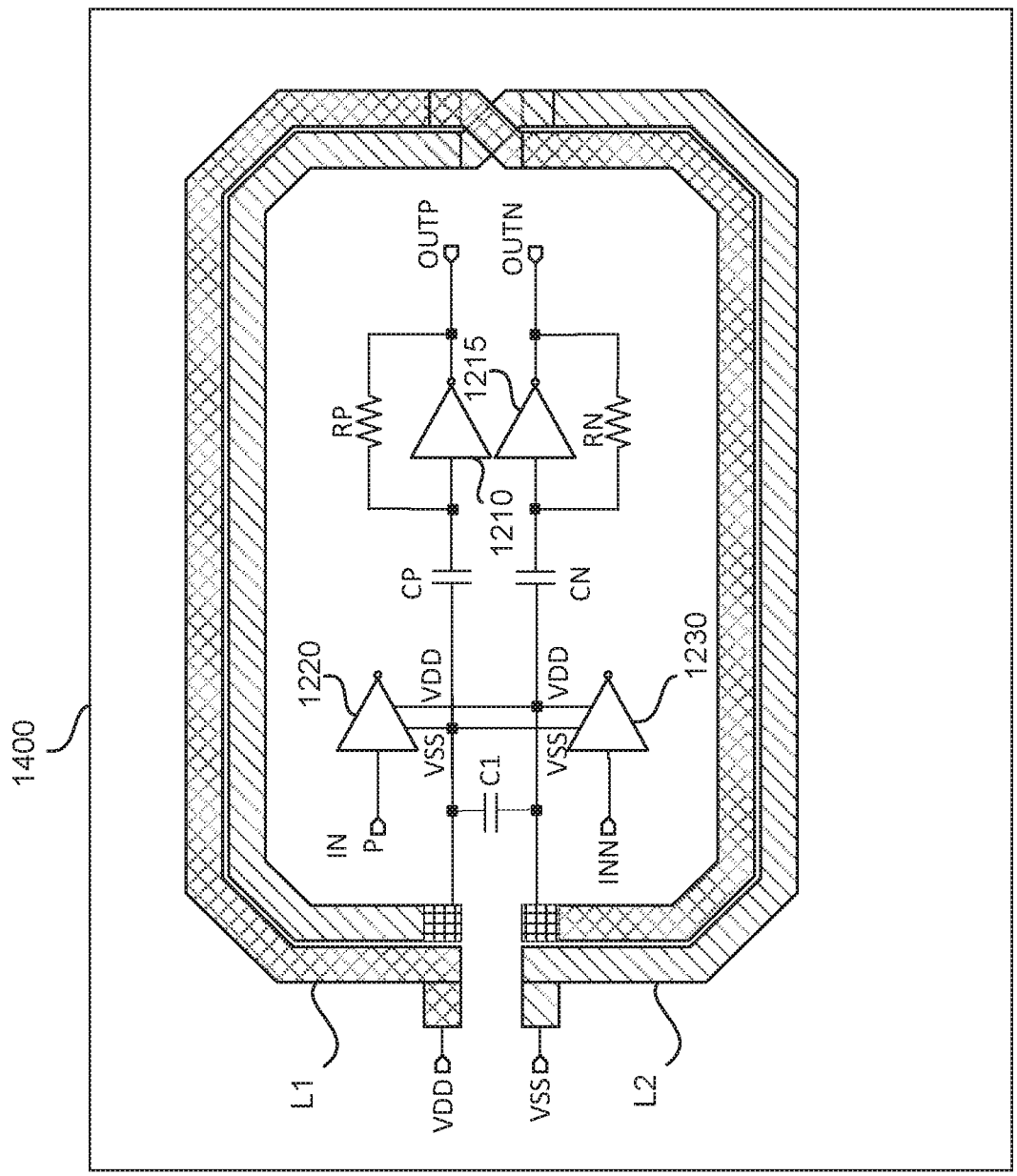
FIG. 14 illustrates an example substrate having a circuit for doubling a frequency of a differential signal, according to some aspects.

FIG. 14 illustrates an example substrate 1400 having a circuit for doubling a frequency of a differential signal, according to some aspects. The substrate includes a first inductor L1 and a second inductor L2. As shown in FIG. 14, each inductor can be formed as an inductive loop, such as a conductor having a desired inductive property. The inductors L1 and L2 can be cross-coupled, such as to cause a first portion of L1 to be circumscribed by a first portion of L2, while causing a second portion of L2 to be circumscribed by a second portion of LL. The substrate 1400 also includes capacitor C1, inverters 1220 and 1230, coupling capacitors CP and CN, and self-biasing buffers 1210 and 1215 disposed over an area circumscribed by L1 and L2. The substrate layout shown in FIG. 14 can enable L1 and L2 to be substantially identical while reducing layout area.

Figure 15:
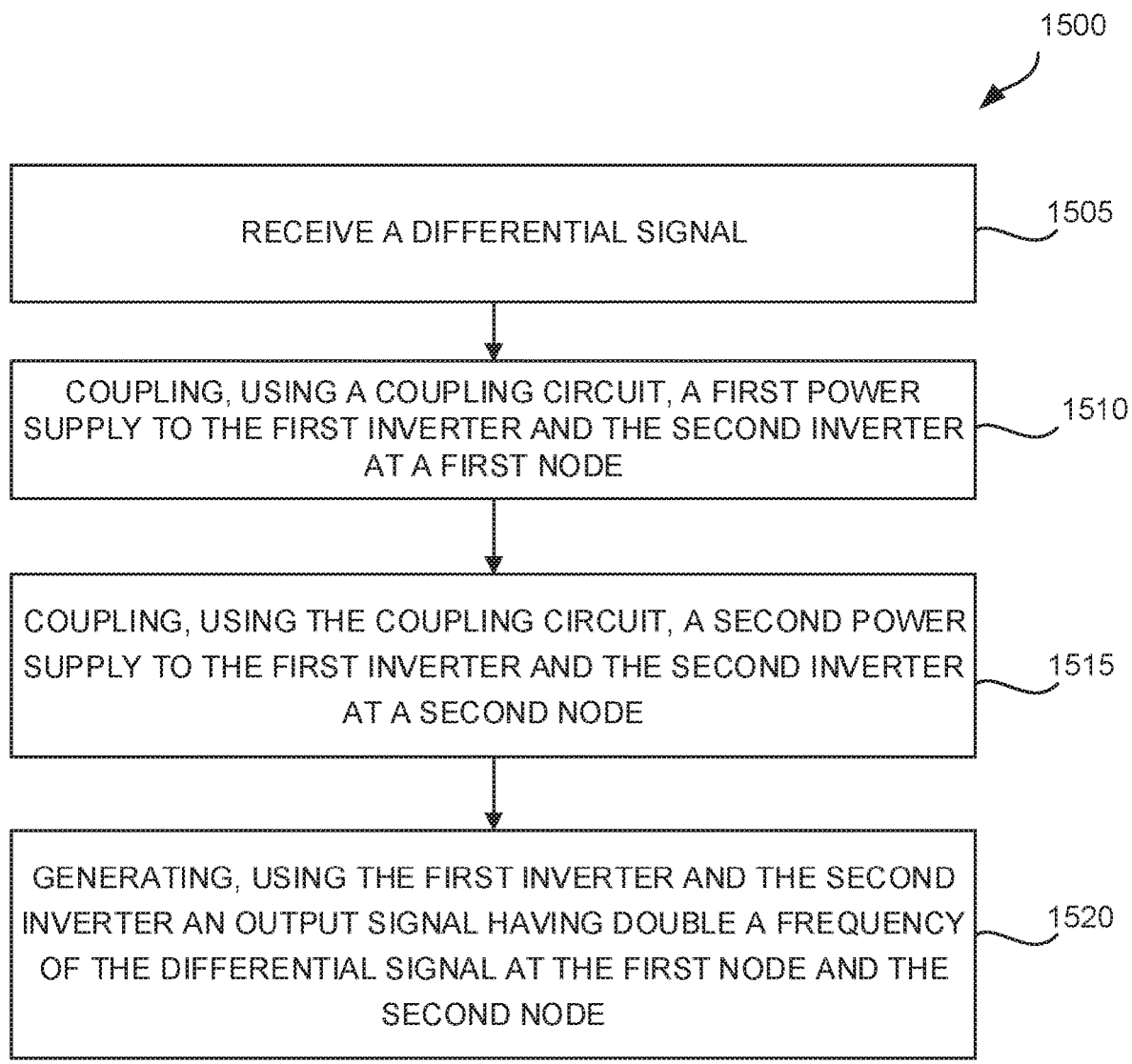
FIG. 15 illustrates a flowchart of a set of operations for operating a system having a circuit for doubling a frequency of a differential signal, according to some aspects.

FIG. 15 illustrates a flowchart of a set of operations 1500 for operating a system having a circuit for doubling a frequency of a differential signal, according to some aspects. The frequency system can include the frequency doubler 1205, as shown in FIG. 12. At operation 1505, a differential input signal can be received. The differential input signal can be, for example, a differential voltage-mode output of an oscillator circuit, as described herein. Receiving the differential signal can include receiving a first component of the differential signal at an input terminal of a first inverter, and receiving a second component at an input terminal of a second inverter.

At operation 1510, a first rail of power, or voltage, supply can be coupled to the first inverter and to the second inverter at a first node, such as to form a first rail of a local power supply. In an example, a high rail of a global, or common, power supply can be coupled (e.g., using a coupling circuit having a desired impedance) to PFETs in the first inverter and the second inverter, such as to form a high rail of a local power supply.

At operation 1515, a second rail of a second power supply can be coupled to the first inverter and to the second inverter at a second node. In another example, low rail of a global, or common, power supply can be coupled to NFETs in the first inverter and the second inverter, such as to form a low rail of a local power supply. In some aspects, the power supplies can be coupled to the inverters using a pair of cross-coupled inductors in a coupling circuit, as described herein.

At operation 1520, an output signal, such as a differential signal, can be generated using the first inverter and the second inverter. The output signal can have twice, or double, the frequency of the received differential signal. In some aspects, the output signal can be generated at the first node and at the second node. Generating the output signal can include causing, in response to the first component of the differential signal, the first inverter to conduct a first current from the first voltage supply through the first node to the second voltage supply through the second node while the first component of the differential signal is within a threshold voltage range. Generating the output signal can also include causing, in response to the second component of the differential signal, the second inverter to conduct a second current from the first voltage supply through the first node to second voltage supply through the second node while the second component of the differential signal is within the threshold voltage range.

In some aspects, the operations 1500 can also include conditioning the differential signal to cause the first inverter and the second inverter to alternatively conduct two cycles of the first current and the second current during each half cycle of the differential signal. Such conditioning can include amplifying or buffering the differential signal to ensure that the signal has a large enough amplitude or voltage swing to drive the first and second inverters, as described herein.

In some aspects, the operations 1500 can also include causing at least two cross-coupled inductors in the coupling circuit to resonate with a capacitor in the coupling circuit at double a frequency of the differential signal.

In some aspects, the operations 1500 can also include causing, in response to the first current and the second current, a current flowing from the first voltage supply into the first node and out of the second node into the second voltage supply to have double a frequency of the differential signal.

Figure 16:
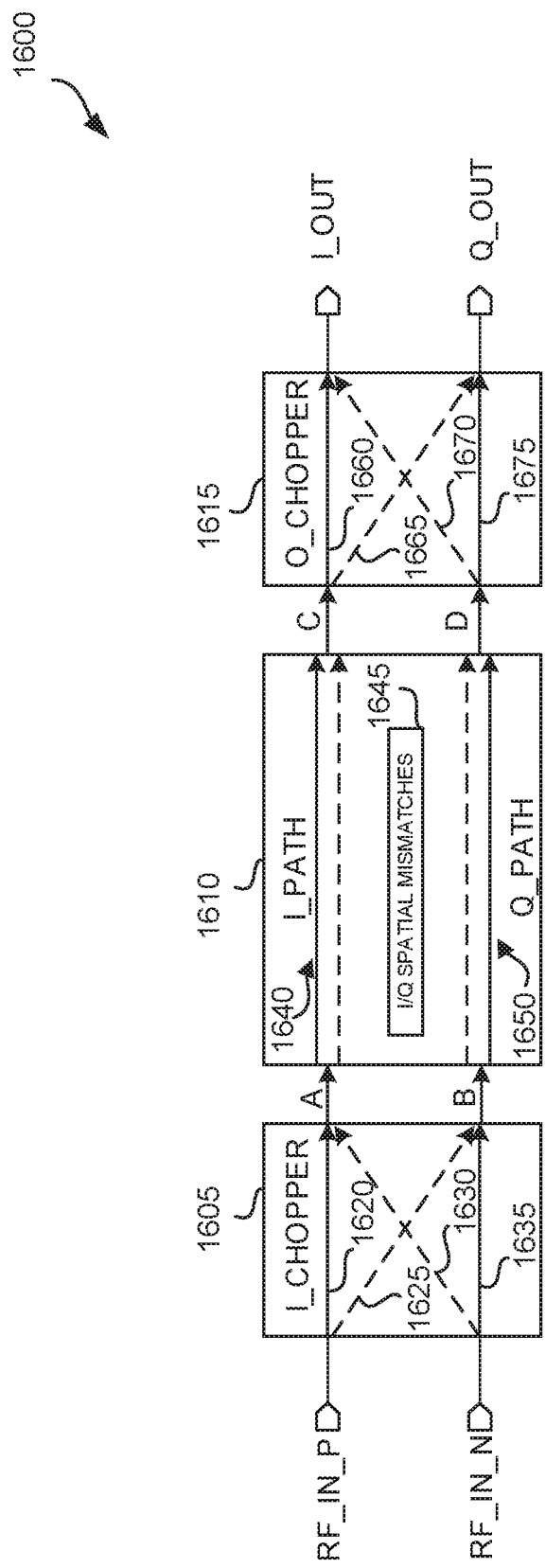
FIG. 16 illustrates an example system for processing a signal to reduce spatial mismatches, according to some aspects.

FIG. 16 illustrates an example system 1600 for processing a signal to reduce spatial mismatches, according to some aspects. The system 1600 can be a portion of any system configured to process two or more components of a signal using processing circuitry 1600, such as a transceiver having a receive chain with parallel circuitry for generate in-phase and quadrature baseband signals from a received RF signal. Spatial mismatches cased in such baseband signals by, for example, device or route mismatches in the parallel circuitry can result in errors, such as quadrature phase and gain errors, during later processing of the baseband signals, such as during demodulation. The system 1600 can mitigate, or reduce, such errors by alternating between paths used to generate components of an output signal from an input signal. Although aspects of present disclosure are discussed in terms of processing a signal through in-phase and a quadrature circuitry or paths of a transceiver, it is understood that the techniques described can be useful for processing other signals using other circuitry or processing paths.

In FIG. 16, a differential RF signal can be received at inputs RF_IN_P and RF_IN_N of the system 1600. An input switching circuit 1605 can steer the two components of the RF signal to input paths A or B, such as to cause the processing circuitry 1610 to process the RF signal though substantially identical processing paths 1640 and 1650. Two processing paths can be substantially identical when they each produce matching outputs in response to the same inputs. The differential RF signal can then be processed using circuitry 1610. In some aspects, path 1640 (e.g., an I-channel or path) can include circuitry for generating an in-phase component of a Cartesian modulated RF signal, while path 1650 (e.g., a Q-channel or path) can include circuitry for generating a quadrature component of the Cartesian modulated RF signal. Signals processed through paths 1640 and 1650 can be to subject path or device defects which may cause spatial mismatches. The outputs C and D of the processing circuitry 1610 can then steered to an appropriate system output I_OUT or Q_OUT by output switching circuit 1615.

The switching circuit 1605 and switching circuit 1615 can include one or more switching devices or circuits, such as for steering an input to the switching circuit to a selected output of the switching circuit. In some aspects, the number of signals in each input A and B and be different from the number of signals in each output C and D. Consequently, switching circuit 1605 can include a different number of switching devices than switching circuit 1615. In some aspects, switching circuits 1605 and 1615 can be configured to switch synchronously, such as by using one or more clock circuits. In some examples the one or more clock circuits can be configured, or adjusted, such as by changing frequency or duty cycle, to reduce spatial mismatches.

In an example operation of the system 1600, inputs RF_IN_P and RF_IN_N can be steered, such as by a first clock circuit or a first edge of a clock signal generated by a first clock circuit, to processing circuitry inputs A and B, respectively using switching device 1620 and 1635. Such inputs can then be processed by processing circuitry 1610 through paths 1640 and 1650 to generate processing circuitry outputs C and D, respectively. Processing circuitry outputs C and D can then be steered to system outputs I_OUT and Q_OUT by switching elements 1660 and 1675 in switching circuit 1615.

In a complementary example operation of the system 1600, inputs RF_IN_P and RF_IN_N can be steered, such as by a second clock circuit or a second edge of a clock signal generated by the second clock circuit, to processing circuitry inputs B and A, respectively, using switching device 1625 and 1630. Such inputs can then be processed by processing circuitry 1610 through paths 1640 and 1650 to generate processing circuitry outputs C and D. Processing circuitry outputs C and D can then be steered to system outputs Q_OUT and I_OUT by switching elements 1665 and 1670 in switching circuit 1615, such as to provide outputs consistent with the previous example operation.

Figure 17:
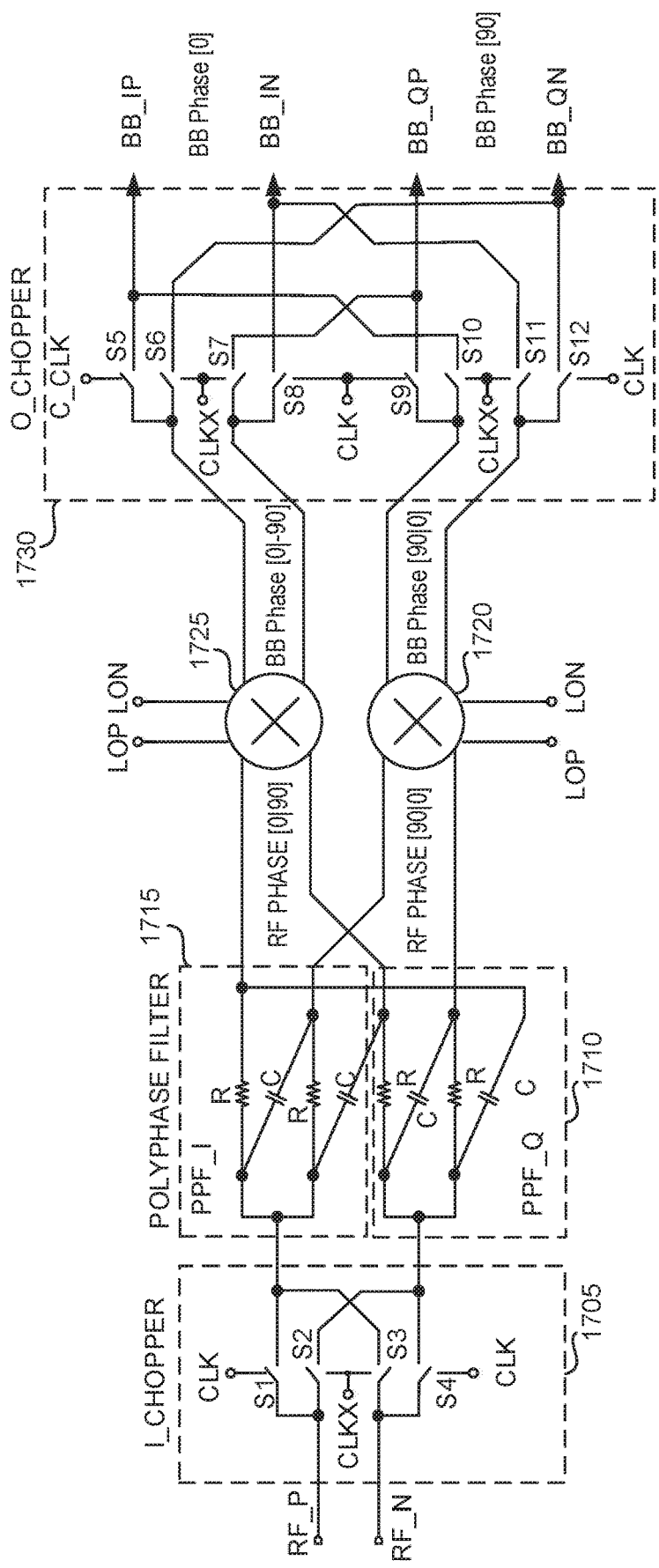
FIG. 17 illustrates an example schematic of a system for processing a signal to reduce spatial mismatches, according to some aspects.

FIG. 17 illustrates a schematic of an example system 1700 for processing a signal to reduce spatial mismatches, according to some aspects. The system 1700 can be an example of the system 1600. The system 1700 includes an input switching circuit 1705, polyphase filters 1710 and 1715, frequency mixers 1725 and 1720, and output switching circuit 1730. The input switching circuit 1705 and the output switching circuit 1730 can be an example of the input switching circuit 1605 and the output switching circuit 1615, as shown in FIG. 16. The polyphase filter 1710 and 1715, and the frequency mixer 1720 and 1725 can be an example of processing circuitry 1610, as shown in FIG. 16.

In FIG. 16, the polyphase filters 1710 and 1715 can convert differential RF input RF_P and RF_N to RF in-phase and quadrature signals, which can then be processed by the frequency mixers 1720 and 1725 to generate differential baseband signals BB_IP/BB_IN and BB_QP/BB_QN. The input switching circuits 1705 and 1725 can be controlled by clocks, or clocking signals, generated by clocking circuitry CLK and CLKX. In some aspects clocks CLK and CLKX can be mutually exclusive or complementary clock signals.

In an example operation, CLK can cause the input switching circuit 1705 to steer differential RF input RF_P and RF_N to be simultaneously processed by polyphase filters 1710 and 1715, respectively, such as to generate RF in-phase and quadrature signals RF Phase[0] and RF Phase[90]. The frequency mixers 1720 and 1725 can then covert RF Phase [0] and RF Phase[90] to haseband signals BB Phase[0] and BB Phase[90]. The switching circuit 1730 can then steer BB Phase[0] and BB Phase[90] to output ports BB_IP/BB_IN and BB_QP/BB_QN as outputs BB Phase [0] and BB Phase [90], respectively.

In a complementary example, CLKX can cause the input switching circuit 1705 steer the differential RF input RF_P and RF_N to be simultaneously processed by polyphase filters 1710 and 1715, such as to generate RF in-phase and quadrature signals RF Phase[90] and RF Phase[0]. The frequency mixers 1720 and 1725 can then covert RF Phase [90] and RF Phase[0] to baseband signals BB Phase[90] and BB Phase[0]. The switching circuit 1730 can then steer BB Phase[90] and BB Phase[0] to output ports BB_QP/BB_QN and BB_IP/BB_IN as outputs BB Phase [90] and BB Phase [0], respectively.

As a result of the operations of switching circuits 1705 and 1730 in the previous examples, when CLK controls the switching circuits, output ports BB_IP/BB_IN can receive the signals processed through polyphase filter 1715 and frequency mixer 1725, while output ports BB_QP/BB_QN can receive signals processed through polyphase filter 1710 and frequency mixer 1720. Similarly, when CLKX controls the switching circuits, output ports BB_IP/BB_IN can receive the signals processed through polyphase filter 1710 and frequency mixer 1720, while output ports BB_QP/ BB_QN can receive signals processed through polyphase filter 1715 and frequency mixer 1725. Such switching can cause spatial mismatches between the processing path having polyphase filter 1715 and frequency mixer 1725 and the processing path having polyphase filter 1710 and frequency mixer 1720 to average out, or attenuate, over time.

Figure 18:
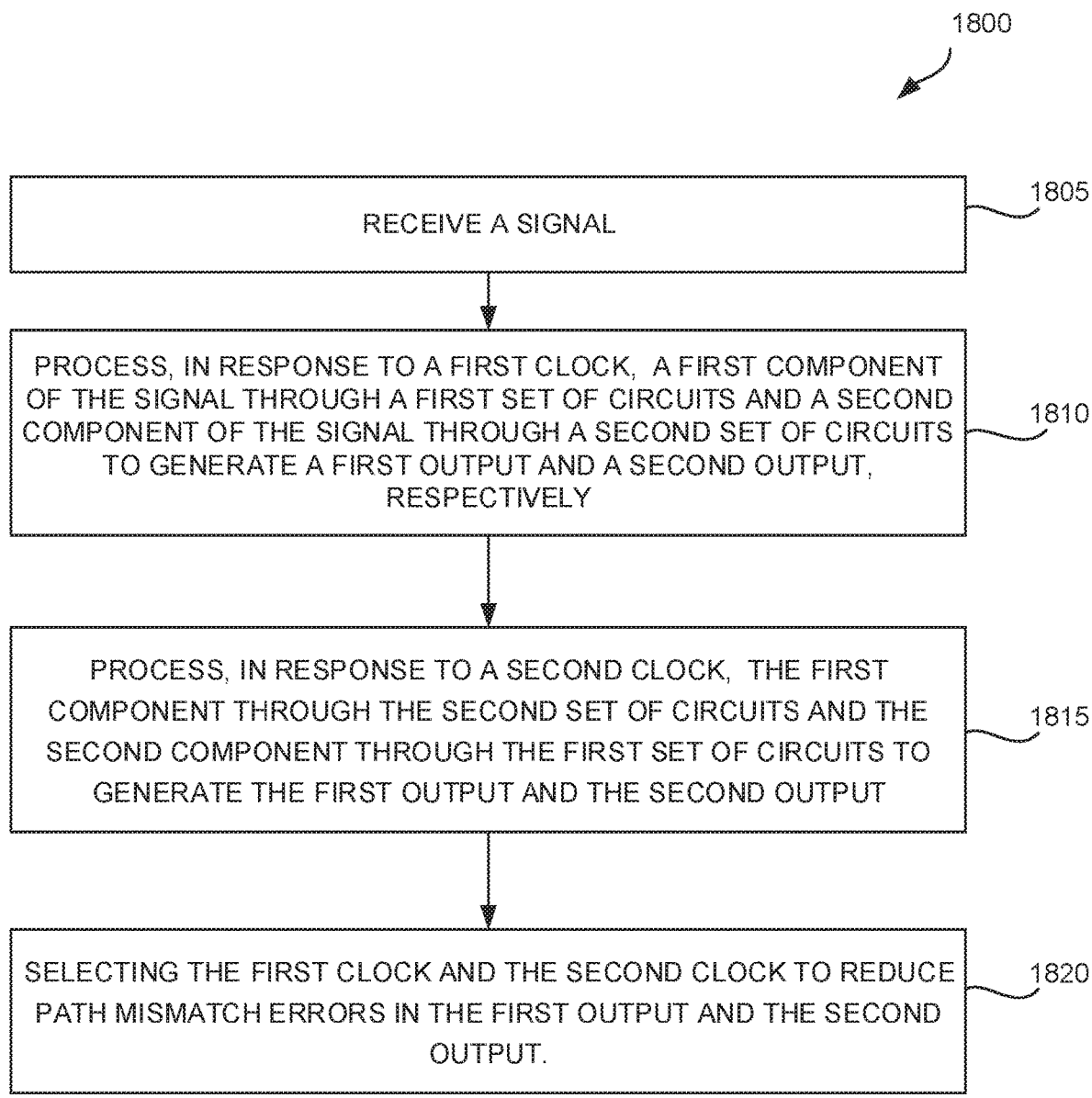
FIG. 18 illustrates a flowchart of a set of operations for operating a system for processing a signal to reduce spatial mismatches, according to some aspects.

FIG. 18 illustrates a flowchart of a set of operations 1800 for operating a system for processing a signal to reduce spatial mismatches, according to some aspects. The system can be example of the system 1600 (FIG. 16) or the system 1700 (FIG. 17).

At operation 1805, an input signal can be received a receiving circuit. In some aspects the input signal can be a differential RF signal, such as an RF signal that has been RF-modulated using quadrature modulation. The receiving circuit can be a switching circuit, such as the switching circuit 1605 (FIG. 16) and the switching circuit 1705 (FIG. 17).

At operation 1810, a first component of the received signal can be processed, in response to a first clock, through a first set of circuits, while a second component of the received signal can be processed through a second set of circuits, such as to generate a first output and a second output, respectively, at a set of output ports. In some aspects, the first set of circuits can be an in-phase path in a receive signal chain of a transceiver, such as the in-phase path formed by polyphase filter 1715 and frequency mixer 1725, as shown in FIG. 17. Similarly, the second set of circuits can be a quadrature path in a receive signal chain of a transceiver, such as the quadrature path formed by polyphase filter 1710 and frequency mixer 1720, as shown in FIG. 17. In certain aspects, processing the first component of the signal and the second component of the signal can include generating a baseband in-phase signal at a first output of the first set of circuits and a baseband quadrature signal at the second output of the second set of circuits.

At operation 1815, the first component of the received signal can be processed, in response to a second clock, through the second set of circuits, while the second component of the received signal can be processed through the second set of circuits, such as to generate the first output and the second output, respectively, at the same set of output ports.

At operations 1820, the first clock or the second clock can be adjusted to reduce, or improve the reduction of, spatial (or path) mismatch errors in the first output and the second output.

Figure 19:
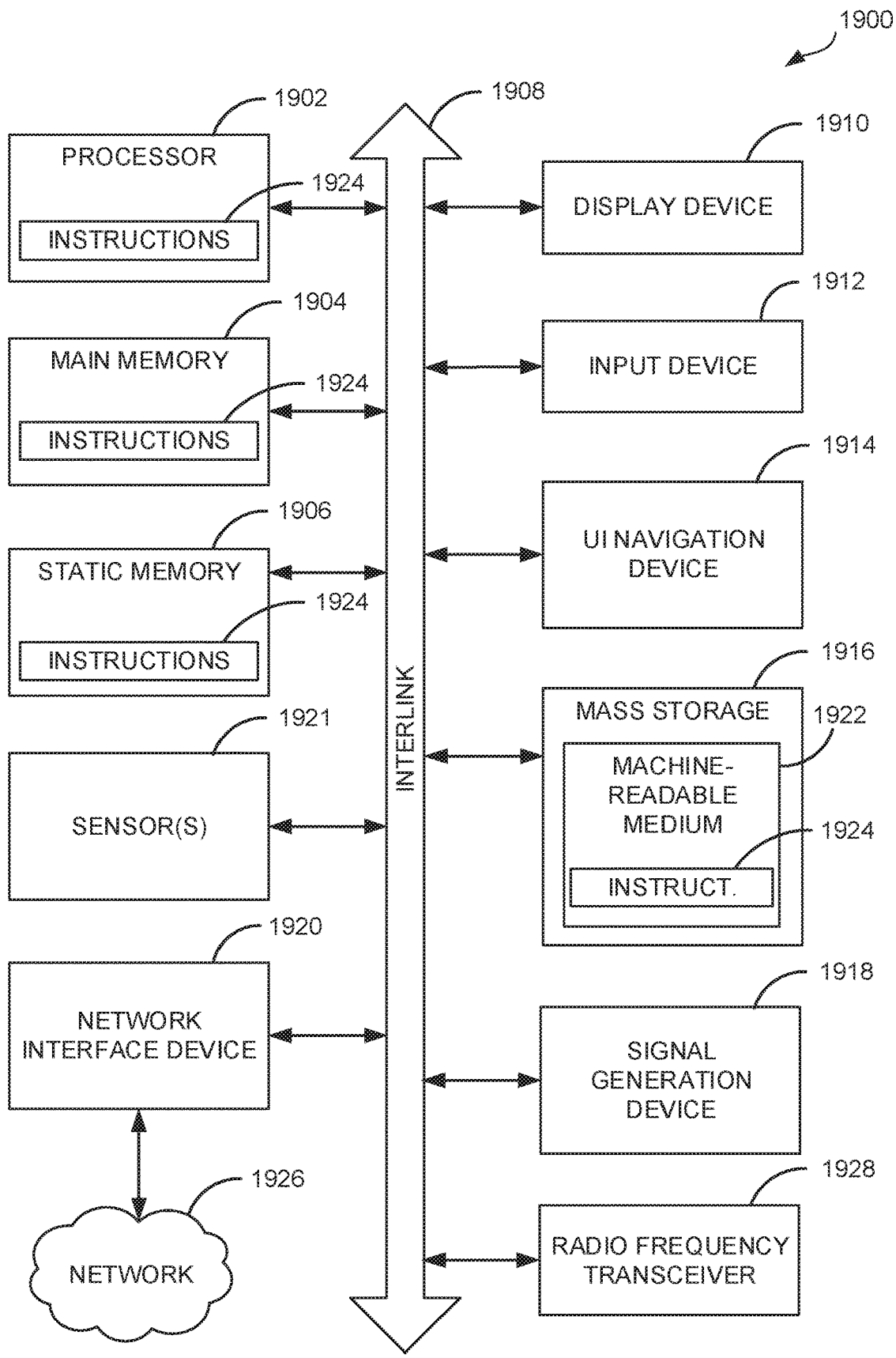
FIG. 19 is a block diagram illustrating an example of an electronic device that includes a radio communication device, such as a transceiver having circuits for processing radio frequency signals, according to some aspects.

FIG. 19 is a block diagram illustrating an example of an electronic device 1900 that can include a millimeter wave radio communication device 1928, having circuits, such as an RF transceiver, for processing a radio frequency signal, according to some aspects. In alternative aspects, the electronic device operates as a standalone device or may be connected (e.g., networked) to other electronic devices. In a networked deployment, the electronic device may operate in the capacity of either a server or a client electronic device in server-client network environments, or it may act as a peer electronic device in peer-to-peer (or distributed) network environments. The electronic device may be a head-mounted display, wearable device, personal computer (PC), a tablet PC, a hybrid tablet, a personal digital assistant (PDA), a mobile telephone, or any electronic device capable of executing instructions (sequential or otherwise) that specify actions to be taken by that electronic device. Further, while only a single electronic device is illustrated, the term "electronic device" shall also be taken to include any collection of electronic devices that individually or jointly execute a set (or multiple sets) of instructions to perform any one or more of the methodologies discussed herein. Similarly, the term "processor-based system" shall be taken to include any set of one or more electronic devices that are controlled by or operated by a processor (e.g., a computer) to individually or jointly execute instructions to perform any one or more of the methodologies discussed herein.

Example electronic device 1900 includes at least one processor 1902 (e.g., a central processing unit (CPU), a graphics processing unit (GPU) or both, processor cores, compute nodes, etc.), a main memory 1904 and a static memory 1906, which communicate with each other via a link 1908 (e.g., bus). The electronic device 1900 may further include a video display unit 1910, an alphanumeric input device 1912 (e.g., a keyboard), and a user interface (UI) navigation device 1914 (e.g., a mouse). In one embodiment, the video display unit 1910, input device 1912 and UI navigation device 1914 are incorporated into a touch screen display. The electronic device 1900 may additionally include a storage device 1916 (e.g., a drive unit), a signal generation device 1918 (e.g., a speaker), a network interface device 1920, and one or more sensors (not shown), such as a global positioning system (GPS) sensor, compass, accelerometer, gyrometer, magnetometer, or another sensor. The computing system may further include a radio frequency communication device or transceiver 1928. The radio frequency communication device or transceiver 1928 can be an example of a millimeter wave communication device as discussed herein.

The storage device 1916 includes a machine-readable medium 1922 on which is stored one or more sets of data structures and instructions 1924 (e.g., software) embodying or utilized by any one or more of the methodologies or functions described herein. The instructions 1924 may also reside, completely or at least partially, within the main memory 1904, static memory 1906, and/or within the processor 1902 during execution thereof by the electronic device 1900, with the main memory 1904, static memory 1906, and the processor 1902 also constituting machine-readable media.

While the machine-readable medium 1922 is illustrated in an example embodiment to be a single medium, the term "machine-readable medium" may include a single medium or multiple media (e.g., a centralized or distributed database, and/or associated caches and servers) that store the one or more instructions 1924. The term "machine-readable medium" shall also be taken to include any tangible medium that is capable of storing, encoding or carrying instructions for execution by the electronic device and that cause the electronic device to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks magneto-optical disks; and CD-ROM and DVD-ROM disks.

The instructions 1924 may further be transmitted or received over a communications network 1926 using a transmission medium via the network interface device 1920 utilizing any one of a number of well-known transfer protocols (e.g., HTTP). Examples of communication networks include a local area network (LAN), a wide area network (WAN), the Internet, mobile telephone networks, plain old telephone (POTS) networks, and wireless data networks (e.g., Bluetooth, Wi-Fi, 3G, and 4G LTE/LTE-A, 5G, DSRC, or WiMAX networks). The term "transmission medium" shall be taken to include any intangible medium that is capable of storing, encoding, or carrying instructions for execution by the electronic device, and includes digital or analog communications signals or other intangible medium to facilitate communication of such software.

Figure 20:
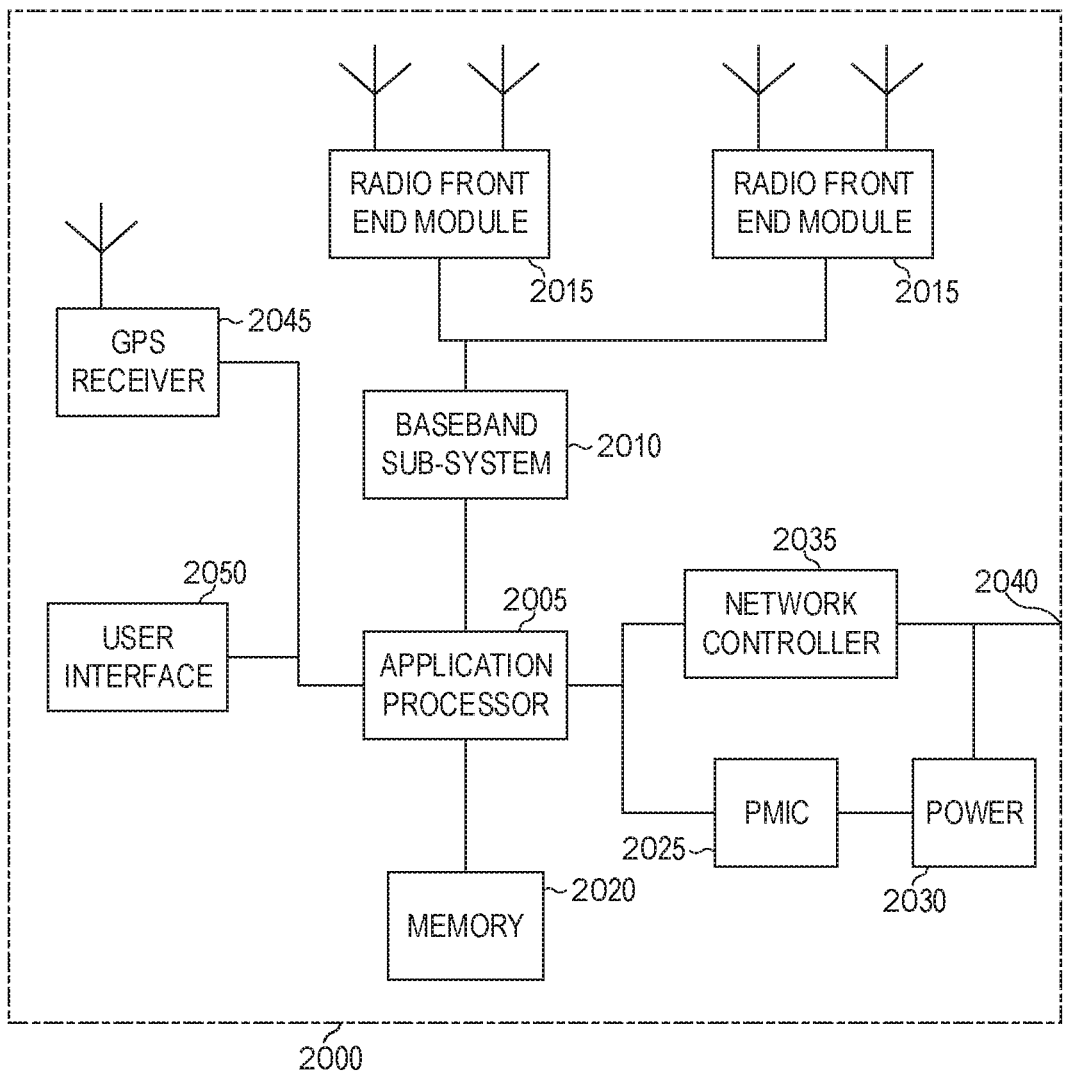
FIG. 20 illustrates an example of a base station or infrastructure equipment radio head according to some aspects.

FIG. 20 illustrates an exemplary base station or infrastructure equipment radio head according to some aspects. The base station radio head 2000 may include one or more of application processor 2005, baseband processors 2010 such as the baseband circuitry 110 (FIG. 1) and protocol processing circuitry 105 (FIG. 1), one or more radio front end modules 2015, memory 2020, power management integrated circuitry (PMIC) 2025, power tee circuitry 2030, network controller 2035, network interface connector 2040, satellite navigation receiver (e.g., GPS receiver) 2045, and user interface 2050. In some aspects the one or more radio front end modules 2015 can include a millimeter wave communication device such as the described herein.

In some aspects, application processor 2005 may include one or more CPU cores and one or more of cache memory, low drop-out voltage regulators (LDOs), interrupt controllers, serial interfaces such as SPI. I2C or universal programmable serial interface, real time clock (RTC), timer-counters including interval and watchdog timers, general purpose IO memory card controllers such as SD/MMC or similar, USB interfaces, MIPI interfaces and Joint Test Access Group (JTAG) test access ports.

In some aspects, baseband processor 2010 may be implemented, for example, as a solder-down substrate including one or more integrated circuits, a single packaged integrated circuit soldered to a main circuit board or a multi-chip sub-system including two or more integrated circuits.

In some aspects, memory 2020 may include one or more of volatile memory including dynamic random access memory (DRAM) and/or synchronous DRAM (SDRAM), and nonvolatile memory (NVM) including high-speed electrically erasable memory (commonly referred to as Flash memory), phase-change random access memory (PRAM), magnetoresistive random access memory (MRAM), and/or a three-dimensional crosspoint memory. Memory 2020 may be implemented as one or more of solder down packaged integrated circuits, socketed memory modules and plug-in memory cards.

In some aspects, power management integrated circuitry 2025 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 2030 may provide for electrical power drawn from a network cable. Power tee circuitry 2030 may provide both power supply and data connectivity to the base station radio head 2000 using a single cable.

In some aspects, network controller 2035 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 2045 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 2045 may provide, to application processor 2005, data which may include one or more of position data or time data. Time data may be used by application processor 2005 to synchronize operations with other radio base stations or infrastructure equipment.

In some aspects, user interface 2050 may include one or more of buttons. The buttons may include a reset button. User interface 2050 may also include one or more indicators such as LEDs and a display screen.

The above detailed description includes references to the accompanying drawings, which form a part of the detailed description. The drawings show, by way of illustration, specific aspects that may be practiced. These aspects are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other aspects may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as aspects may feature a subset of said features. Further, aspects may include fewer features than those disclosed in a particular example. Thus, the following claims are hereby incorporated into the Detailed Description, with a claim standing on its own as a separate embodiment. The scope of the aspects disclosed herein is to be determined with reference to the appended claims, along with the full scope of equivalents to which such claims are entitled.

What is claimed is:

1. A buffer circuit, comprising:
 a first feedback buffer to receive a first component of a current-mode signal and a second feedback buffer to receive a second component of the current-mode signal;
 a first inverter comprising:
  a first input coupled to an output of the second feedback buffer and to an input of a first current gain circuit through a first filter, and
  a first output coupled to an input of the first feedback buffer; and
 a second inverter comprising:
  a second input coupled to an output of the first feedback buffer and to an input of a second current gain circuit through a second filter, and
  a second output coupled to an input of the second feedback buffer.

2. The buffer circuit of claim 1, wherein at least one of the first current gain circuit and the second current gain circuit comprises a plurality of N-type field-effect-transistors (NFETs) coupled in parallel.

3. The buffer circuit of claim 2, wherein a size of the plurality of NFETs matches a size of an NFET in at least one of the first inverter and the second inverter.

4. The buffer circuit of claim 1, wherein at least one of the first filter and the second filter is a low-pass resistor-capacitor (RC) filter, the low-pass RC filter being configured to reject out of band noise in a current mirrored to at least one of the first current gain circuit and the second current gain circuit.

5. The buffer circuit of claim 1, wherein the buffer circuit is configured to:
 cause a first current flowing into the buffer circuit responsive to the first component of the current-mode signal to flow through an NFET of the first inverter to be mirrored at an output of the first current gain circuit, and
 cause a second current flowing out of the buffer circuit responsive to the second component of the current-mode signal to flow through an P-type FET (PFET) of the second inverter to inhibit an output of the second current gain circuit.

6. The buffer circuit of claim 1, wherein the buffer circuit is configured to cause a first NFET in the first inverter and a second NFET in the second inverter to alternatively turn ON and OFF responsive to the current-mode signal to generate a class-B current-mode signal at an output of the first current gain circuit and at an output of the second current gain circuit.

7. The buffer circuit of claim 1, wherein:
 the first inverter and the second inverter comprise an NFET,
 a voltage level of low rail of a first voltage supply to the first buffer and the second buffer is at a threshold voltage of the NFET, and
 a voltage level of a high rail of the first voltage supply is at least a threshold voltage of the NFET lower than a voltage level of a high rail of a second voltage supply to at least one of the first inverter and the second inverter.

8. The buffer circuit of claim 1, further comprising:
 a bias circuit to determine the low rail of the first voltage supply and the high rail of the first voltage supply, the bias circuit comprising:
  a diode connected transistor to determine a reference voltage, and
  a current mirror to generate a bias current based on the reference voltage, the current mirror comprising a first output and a second output configured to generate a low rail of a voltage supply of the first buffer and the second buffer and a high rail of the voltage supply of first buffer and the second buffer.

9. The buffer circuit of claim 8, wherein the bias circuit further comprises:
 an amplifier to determine a current generated at the first output and at the second output of the current mirror based on the reference voltage and a feedback voltage from of the first input of the first inverter and the second input of the second inverter.

10. The buffer circuit of claim 9, wherein the bias circuit further comprises a common-mode feedback RC network coupled to a feedback input of the amplifier and to both the first input of the first inverter and the second input of the second inverter.

11. The buffer circuit of claim 8, wherein the diode connected transistor is NFET, the NFET sized to match an NFET in at least one of the first inverter and the second inverter.

12. A method for operating a signal buffer, the method comprising:
 receiving a differential current-mode signal at a first buffer and at a second buffer;
 mirroring, by a first inverter of a set of two or more inverters cross-coupled with the first buffer and the second buffer, a first component of the differential current-mode signal flowing into the signal buffer to a first current gain circuit when the differential current-mode signal is in a first state; and
 mirroring, by a second inverter of the set of two or more inverters, a second component of the differential current-mode signal flowing into the signal buffer to a second current gain circuit when the differential current-mode signal is in a second state.

13. The method of claim 12, further comprising filtering the mirrored first component and the second component using a low-pass filter.

14. The method of claim 12, wherein causing the first inverter to mirror the first component of the differential current-mode signal comprises sinking the first component of the differential current-mode signal through an N-type field-effect-transistor (NFET) of the first inverter.

15. The method of claim 12, further comprising:
providing a first voltage supply to the first buffer and to the second buffer;
providing a second voltage supply to power first inverter and the second inverter; and
determining a direct-current bias point for the first inverter and the second inverter based on the first supply voltage and an output of the first buffer and the second buffer.

16. The method of claim 15, wherein the first inverter and the second inverter comprises an NFET, and providing the first voltage supply comprises:
providing a high voltage rail of the first voltage supply that is a threshold voltage of the NFET lower than a high voltage rail of the second voltage supply, and
providing a low voltage rail of the first voltage supply that is a threshold voltage of the NFET higher than a low voltage rail of the second voltage supply.

17. The method of claim 12, wherein causing the first inverter to mirror the second component of the differential current-mode signal and causing the second inverter to mirror the second component of the differential current-mode signal comprises:
causing the first inverter and the second inverter to alternatively turn ON and OFF responsive to the differential current-mode signal to generate a class-B current-mode signal at an output of the first current again circuit and at an output of the second current gain circuit.

18. A system comprising:
a transceiver circuit; and
a signal buffer to receive a differential signal current-mode signal from the transceiver circuit, the signal buffer comprising:
a first buffer having a first input coupled to a first input node to receive a first component of an input signal,
a second buffer having a second input coupled to a second input node to receive a second component of the input signal,
a first inverter comprising a first P-type field-effect-transistor (PFET) and a first N-type field-effect-transistor (NFET) coupled between a high rail and a low rail of a first voltage supply, the first inverter having a third input coupled to an output of the second buffer, the first inverter having an output coupled to the first input node,
a second inverter comprising a second PFET and a second NFET coupled between the high rail and the low rail of the first voltage supply, the second inverter having a fourth input coupled to an output of the first buffer, the first inverter having a second output coupled to the second input node,
a first filter to couple a mirrored current from the first NFET to a first current gain circuit when the differential signal current-mode has a first state, and
a second filter to couple a mirrored current from the second NFET to a second current gain circuit when the differential signal current-mode has a second state.

19. The system of claim 18, wherein signal buffer is configured to cause the first NFET and the second NFET to alternatively turn ON and OFF responsive to the input signal being in the first state or the second state to generate a class-B current-mode signal at an output of the first current gain circuit and at an output of the second current gain circuit.

20. The system of claim 18, wherein
a voltage level of low rail of a first voltage supply to the first buffer and the second buffer is at a threshold voltage of the NFET, and
a voltage level of a high rail of the first voltage supply is a threshold voltage of the NFET lower than a voltage level of a high rail of a second voltage supply to the first inverter.

\* \* \* \* \*